(12) United States Patent
Tanaka

(10) Patent No.: US 6,982,751 B1
(45) Date of Patent: Jan. 3, 2006

(54) SOLID-STATE IMAGING APPARATUS, ITS DRIVING METHOD, AND CAMERA SYSTEM

(75) Inventor: Hiroaki Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/549,194

(22) Filed: Apr. 13, 2000

(30) Foreign Application Priority Data

Apr. 16, 1999 (JP) ............................... P11-109477

(51) Int. Cl.
*H04N 5/225* (2006.01)
*H04N 5/335* (2006.01)
(52) U.S. Cl. ................................. 348/220.1; 348/322
(58) Field of Classification Search ................ 348/294, 348/298, 299, 302, 303, 304, 311, 312, 314, 348/317, 322, 324, 313; 250/208.1
See application file for complete search history.

(56) References Cited

U.S. PATENT DOCUMENTS

| | | | | |
|---|---|---|---|---|
| 4,963,980 A * | 10/1990 | Suga et al. | ............... | 348/220.1 |
| 5,420,629 A * | 5/1995 | Watanabe | ................ | 348/230.1 |
| 5,528,291 A * | 6/1996 | Oda | ......................... | 348/220.1 |
| 5,880,777 A * | 3/1999 | Savoye et al. | ........... | 348/217.1 |
| 5,880,781 A * | 3/1999 | Udagawa et al. | ........... | 348/279 |
| 5,978,024 A * | 11/1999 | Lee | ............................. | 348/299 |
| 6,124,888 A * | 9/2000 | Terada et al. | ................ | 348/302 |
| 6,335,757 B1 * | 1/2002 | Vodanovic | .................. | 348/311 |
| 6,519,000 B1 * | 2/2003 | Udagawa | ................. | 348/220.1 |
| 6,529,236 B1 * | 3/2003 | Watanabe | ................ | 348/230.1 |
| 6,707,494 B1 * | 3/2004 | Misawa et al. | ............. | 348/273 |

* cited by examiner

*Primary Examiner*—Thai Tran
*Assistant Examiner*—Timothy J. Henn
(74) *Attorney, Agent, or Firm*—Sonnenschein, Nath & Rosenthal LLP

(57) ABSTRACT

A solid-state imaging apparatus and its driving method. Addition of 2 lines for example of signal charges in a horizontal transfer block requires to double the transfer rate in order to execute line transfer of 2 lines of signal charges in a limited horizontal blanking period. In the solid-state imaging apparatus or a camera system having a CCD imaging device capable of operating in two modes of frame read mode and addition read mode, signal charges read from a plurality of sensor blocks are added for 2 pixels for example in a vertical transfer block in the addition read mode and the added signal charges are vertically transferred and a saturation signal charge quantity of the sensor blocks in the addition read mode is set to about ½ of that in the frame read mode. To implement these operations, a substrate bias Vsub2 having a corresponding voltage value is generated by a substrate bias generator to be applied to a semiconductor substrate.

7 Claims, 13 Drawing Sheets

US 6,982,751 B1

SOLID-STATE IMAGING APPARATUS, ITS DRIVING METHOD, AND CAMERA SYSTEM

RELATED APPLICATION DATA

The present application claims priority to Japanese Application No. P11-109477 filed Apr. 16, 1999, which application is incorporated herein by reference to the extent permitted by law.

BACKGROUND OF THE INVENTION

The present invention relates generally to a solid-state imaging apparatus, a method of driving this solid-state imaging apparatus, and a camera system. More particularly, the present invention relates to a solid-state imaging apparatus constituted to add signal charges inside a charge transfer block, a method of driving this solid-state imaging apparatus, and a camera system that uses this solid-state imaging apparatus as an imaging device.

Recently, digital still cameras based particularly on CCD (Charge Coupled Device) imaging devices have come into widespread use. In order to prioritize resolution, some of these digital still cameras use CCD imaging devices based on a so-called all-pixel reading scheme in which the signal charges of all pixels are all read at once at the same time and the signal charge of each one pixel is transferred independently, while others use CCD imaging devices based on a so-called frame reading scheme in which the signal charges of the pixels on odd-number lines and on even-number lines are read alternately for each field and the signal charge of each pixel is transferred independently.

Referring to FIG. 24, there is shown a schematic diagram illustrating the above-mentioned frame reading operation. Shown in this figure is an example in which a color filter composed of 2 prime colors×2 arrays is used. Referring to FIG. 25, there is shown a timing chart illustrating the vertical sync timing of 4-phase vertical transfer clocks $\phi V1$ through $\phi V4$. Referring to FIG. 26, there is shown a timing chart illustrating the horizontal sync timing of these clocks.

Meanwhile, when performing automatic focus (AF) control, automatic white balance (AWB) control, or automatic exposure (AE) control for example, use of the same operating mode as taking still pictures poses disadvantage in the response speed of the automatic controllers supporting these automatic control operations. Especially, use of a CCD imaging device of high pixel density poses a problem of further retarding the response speed of the automatic controllers. Also, use of the same operating mode as taking still pictures when monitoring an subject image on a LCD (Liquid Crystal Display) monitor or the like poses a problem in obtaining a smooth motion picture because of the slow frame rate.

One way of enhancing the frame rate is to increase the data rate of the output signal of the CCD imaging device. However, increasing the output signal data rate requires the provision of a sampling rate converter. In addition, as the clock frequency rises, the power dissipation increases and the cost of parts used is pushed up. Further, a new problem such as deteriorated S/N ratios occurs. For these reasons, it is not desirable to employ the method of increasing the output signal data rate of the CCD imaging device.

On the other hand, there is a so-called line thinning-out operation in which a read pulse is applied in a predetermined iterative unit with respect to a read gate block for reading the signal charges from pixels to read the signals charges of only the pixels of certain lines and send the read signal charges to a vertical transfer block, thereby reducing the number of lines to be outputted to provide a faster imaging signal (namely increasing the frame rate).

FIG. 27 is a schematic diagram illustrating this line thinning-out operation. This diagram shows an example in which a color filter of 2 primary colors×2 arrays is used and the signal charges of only 2 pixels among 8 vertical pixels. FIG. 28 shows a vertical sync timing of 4-phase vertical transfer clocks $\phi V1$ through $\phi V4$. FIG. 29 shows a horizontal sync timing of these clocks. It should be noted that, for the first-phase vertical transfer clock $\phi V1$ and the third-phase vertical transfer clock $\phi V3$, 2 lines of $\phi V1A/\phi V1B$ and $\phi VA/\phi V3B$ are generated.

In this line thinning-out operation, 8 pixels along line (vertical direction) provide an iterative unit. The signal charges for only 2 of these 8 pixels are read. The read signal charges for 2 lines are vertically transferred within a horizontal blanking period, and then a packet containing signal charge and a packet containing no signal charge are added together. Consequently, the number of output lines becomes ¼ of that of the above-mentioned frame read operation, but the frame rate becomes four times as high. At this time, two lines of signal charges are added in the horizontal transfer block. Because of the addition of charged and free packets, the saturation signal charge quantity in the sensor block becomes equal to that obtained in the frame read operation.

Thus, the above-mentioned line thinning-out operation provides faster imaging signals without increasing the data rate. However, this line thinning-out operation inevitably reduces the number of output lines, thereby deteriorating picture quality, or a CCD imaging device having higher number of pixels requires to increase the number of output lines to be thinned out, further deteriorating picture quality.

Another method for increasing frame-rate is available for performing various automatic control operations such as AF, AWB, and AE or a monitor operation by means of an LCD monitoring for example. In this method, the frame rate is increased not by thinning the number of output lines, but by adding signal charges between pixels in the vertical transfer block (hereafter referred to as pixel addition) or adding signal charges between lines in the horizontal transfer block (hereafter referred to as line addition).

According to the above-mentioned method, pixel addition or the line addition reduces the number of output lines, so that picture quality can be enhanced and sensitivity can be increased better than that of the line thinning-out operation in which the signal charges of the lines that are not outputted are discarded.

Conversely, this method increases the charge quantity in the vertical transfer block or the horizontal transfer block, multiplying the number of pixels or the number of lines to be added (or mixed), so that, when a pixel is fully or nearly saturated, the signal charge overflows in the vertical transfer block or the horizontal transfer block. One way of solving this problem is to design the vertical transfer block or the horizontal transfer block so that the charge quantity which is a multicative number of pixels or lines to be added can be handled. However, such a design requires to raise the drive voltage of vertical or horizontal transfer clock, resulting in inevitable increase in power dissipation.

In the related art designed vertical or horizontal transfer block, the saturation signal charge quantity of the sensor block (or the pixel) is determined by the mode of pixel addition. Therefore, the saturation signal charge quantity of the sensor block in the mode for transferring the signal charge of each pixel independently becomes about 1/X, where X is the number of pixels to be added. However, reducing the saturation signal charge quantity of the sensor block deteriorates the characteristics such as S/N ratio and dynamic range, so that it is not desirable to perform such reduction especially in the mode of still picture imaging with picture quality prioritized.

In consideration of the above mentioned requirement, a solid-state imaging apparatus has been proposed (for example, Japanese Published Unexamined Patent Application No. Hei 5-91417) in which it is assumed that the line addition be performed in the horizontal transfer block. In the monitoring mode, the saturation signal charge quantity of the sensor block is set to about a half of the saturation signal charge quantity in the still picture mode, thereby preventing the signal charge added in the horizontal transfer block due to the line addition from overflowing.

As described, in the above-mentioned related technology, setting the saturation signal charge quantity of the sensor block in the monitoring mode to about a half of that in the still picture imaging mode can prevent the signal charge in the horizontal transfer block from overflowing due to the line addition. However, because the line addition is performed by line-transferring two lines of signal charges from the vertical transfer block to the horizontal transfer block within a horizontal blanking period, the following problems are posed.

Because the horizontal blanking period is a limited period of time, the line-transfer of two lines of signal charges within this limited horizontal blanking period requires doubling of the transfer rate. Raising the transfer rate twice as high means raising the frequency of the vertical transfer clock for driving the vertical transfer block. As the vertical transfer clock frequency increases, the handling charge amount in the vertical transfer block runs short due to propagation delay for example. This causes problems, such as signal charge overflow and unwanted radiation when the pixel is fully or nearly saturated.

SUMMARY OF THE INVENTION

It is therefore an object of the present invention to provide a solid-state imaging apparatus, a method of driving the same, and a camera system that are capable of preventing the signal charge overflow in the charge transfer block from occurring due to the addition (or mixing) of signal charges without inducing the frequency of vertical transfer clock to be raised.

In carrying out the invention and according to one aspect thereof, there is provided a solid-state imaging apparatus comprising: a solid-state imaging device having a plurality of sensor blocks arranged in a matrix for performing photoelectric conversion, a vertical transfer block for vertically transferring signal charges read from the plurality of sensor blocks, and a horizontal transfer block for horizontally transferring the signal charges supplied from the vertical transfer block; a driving means for selectively setting a first operation mode for vertically independently transferring the signal charges read from the plurality of sensor blocks and a second operation mode for adding n (n≧2) pixels of signal charges in the vertical transfer block for vertical transfer; and a saturation signal charge quantity setting means for setting a saturation signal charge quantity of the plurality of sensor blocks in the second operation mode to about 1/n of a saturation signal charge quantity of the plurality of sensor blocks in the first operation mode.

In the above-mentioned configuration, in the second operation mode, 2 pixels for example of signal charges are added in the vertical transfer block and the added signal charges are vertically transferred, thereby reducing the number of output lines to ½ without raising the frequency of the vertical transfer clocks as compared with the first operation mode in which signal charges are not added but independently transferred vertically. Consequently, the frame rate becomes twice as high as that in the first operation mode. In addition, setting the saturation signal charge quantity of the sensor block in the second operation mode to about ½ of the saturation signal charge quantity of the first operation mode makes the signal charge quantity after the addition equal to the signal charge quantity read in the first operation mode. This prevents the signal charge overflow due to the pixel addition from occurring in the vertical transfer block and the horizontal transfer block.

In carrying out the invention and according to another aspect thereof, there is provided a solid-state imaging apparatus comprising: a solid-state imaging device having a plurality of sensor blocks arranged in a matrix for performing photoelectric conversion, a vertical transfer block for vertically transferring signal charges read from the plurality of sensor blocks, and a horizontal transfer block for horizontally transferring the signal charges supplied from the vertical transfer block; a driving means for selectively setting a first operation mode for vertically independently transferring the signal charges read from the plurality of sensor blocks and a second operation mode and a second operation mode for, after reading signal charges of only pixels providing a predetermined iterative unit from the plurality of sensor blocks, adding N (N≧2) pixels of signal charges in at least one of the vertical transfer block and the horizontal transfer block for transfer; and a saturation signal charge quantity setting means for setting a saturation signal charge quantity of the plurality of sensor blocks in the second operation mode to about 1/N of a saturation signal charge quantity of the plurality of sensor blocks in the first operation mode.

In the above-mentioned configuration, in the second operation mode, 2 pixels of signal charges are thinned out of every 4 pixels for example in the row direction and the signal charges thus read are added in at least one of the vertical transfer block and the horizontal transfer block, thereby reducing the number of output lines to ¼ of the first operation mode in which the signal charges are not added but independently transferred vertically. Consequently, the frame rate is raised 4 times as high as that in the first operation mode. In addition, setting the saturation signal charge quantity of the sensor block in the second operation mode to about ½ of the saturation signal charge quantity of the first operation mode makes the signal charge quantity after the addition equal to the signal charge quantity read in the first operation mode. This prevents the signal charge overflow due to the pixel addition from occurring in the vertical transfer block and the horizontal transfer block.

BRIEF DESCRIPTION OF THE DRAWINGS

These and other objects of the invention will be seen by reference to the description, taken in connection with the accompanying drawing, in which.

DETAILED DESCRIPTION OF PREFERRED EMBODIMENTS

This invention will be described in further detail by way of example with reference to the accompanying drawings. Now, referring to FIG. 1, there is shown a schematic configuration of a solid-state imaging apparatus according to a first preferred embodiment of the invention. It should be noted that the following description will be made by use of a CCD imaging device of interline transfer (IT) type for example.

Figure 1:
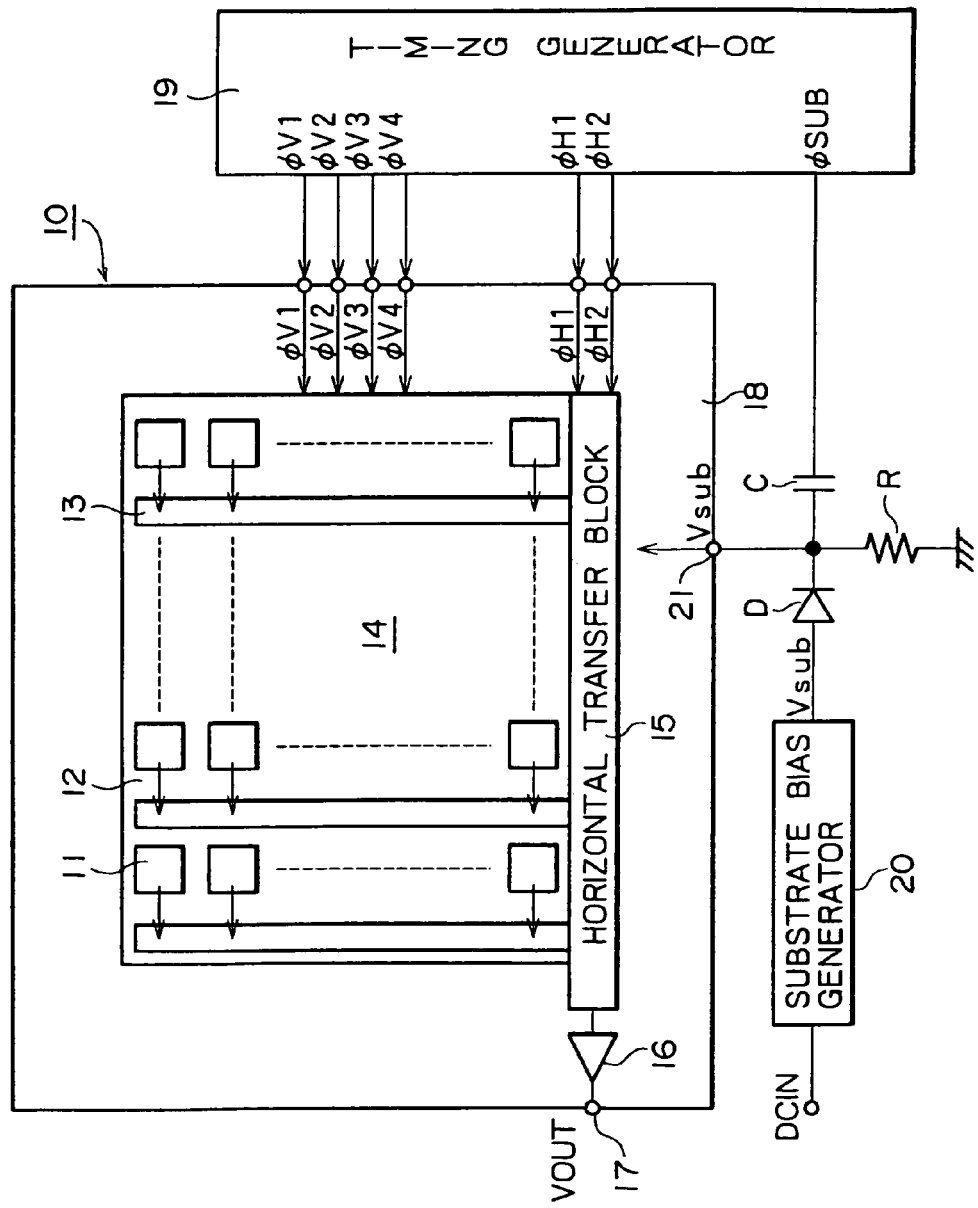
FIG. 1 is a schematic diagram illustrating a configuration of a solid-state imaging apparatus according to a first preferred embodiment of the invention.

As shown in FIG. 1, an imaging area 14 comprises a plurality of sensor blocks 11 arranged in a matrix for converting an incident light into a signal charge having a charge quantity corresponding to the quantity of the incident light and stores the obtained signal charge and a plurality of CCD-based vertical transfer blocks 13 provided for each vertical column of these sensor blocks 11 for vertically transferring a signal charge read by a gate block 12 from each of the sensor blocks 11.

In this imaging area 14, the sensor blocks 11 are each made up of a PN photo diode for example. The signal charges stored in the sensor block 11 are read to the vertical transfer block 13 when a read pulse to be described is applied to the read gate block 12. The vertical transfer block 13 is driven for transfer by 4-phase vertical transfer clocks $\phi V1$ through $\phi V4$ for example, transferring the read signal charges in the vertical direction sequentially in parts corresponding to one scan line (or one line) within a horizontal blanking period.

In the vertical transfer block 13, first-phase and third-phase transfer electrodes also function as a gate electrode of the read gate block 12. Therefore, of the 4-phase vertical transfer clocks $\phi V1$ through $\phi V4$, the first-phase transfer clock $\phi V1$ and the third-phase transfer clock $\phi V3$ are set to take three values of a low level (L), a middle level (M), and a high level (H). A pulse of this H (high) level provides the above-mentioned pulse for reading the read gate block 12, this pulse being referred to as an XSG pulse.

Below the imaging area 14 in the figure, a CCD-based horizontal transfer block 15 is arranged. To this horizontal transfer block 15, one line of signal charges are sequentially supplied from the plurality of vertical transfer blocks 13. The horizontal transfer block 15 is driven for transfer by 2-phase horizontal transfer clocks $\phi H1$ and $\phi H2$ for example, sequentially transferring the one line of signal charges supplied from the plurality of vertical transfer blocks 13, in the horizontal direction within a horizontal scan period after the horizontal blanking period.

The horizontal transfer block 15 is arranged at the end of the transfer destination side thereof with a charge voltage converter 16 of a floating diffusion amplifier configuration for example. This charge voltage converter 16 sequentially converts the signal charges supplied from the horizontal transfer block 15 into a signal voltage and outputs it. This signal voltage is outputted from an output terminal 17 as a CCD output VOUT that corresponds to the quantity of the incident light radiated from an imaging subject.

The above-mentioned sensor block 11, read gate block 12, vertical transfer block 13, horizontal transfer block 15, and charge voltage converter 16 are formed on a semiconductor substrate 18 (hereafter simply referred to as a substrate). Thus, a CCD imaging device 10 of interline transfer type is configured.

The above-mentioned vertical transfer clocks φV1 through φV4 and horizontal transfer clocks φH1 and H2 for driving the CCD imaging device 10 are generated by a timing generator 19. The timing generator 19 functions as a driving means for driving the CCD imaging device 10. In addition to the above-mentioned vertical and horizontal transfer clocks φV1 through φV4 and φH1 and H2, respectively, this timing generator is configured to appropriately generate various timing signals such as a shutter pulse φSUB which is applied to the substrate 18 in order to discharge at once the signal charges stored in all sensor blocks 11 in the electronic shutter mode.

The substrate 18 is externally connected with a substrate bias generator 20 for generating a bias voltage Vsub (hereafter referred to as a substrate bias) for biasing the substrate 18. The substrate bias Vsub generated by the substrate bias generator 20 is applied to the substrate 18 through a diode D and a terminal 21. The voltage value of this substrate bias Vsub determines the saturation signal charge quantity of the sensor block 11 of the CCD imaging device 10. The principle of this determination will be described later.

The shutter pulse φSUB generated by the timing generator 19 is DC-cut by a capacitor C and the resultant pulse is applied to the substrate 18 through the terminal 21. A resistor R is inserted between the terminal 21 and ground. It should be noted that the diode D clamps the L level of the shutter pulse φSUB to the DC level of the substrate bias Vsub.

The present example uses a configuration in which the substrate bias generator 20 is arranged outside the substrate 18. However, it will be apparent to those skilled in the art that the substrate bias generator 20 may be formed on the substrate 18 along with the diode D.

The substrate bias generator 20 functions as a saturation signal charge quantity setting means for switching the saturation signal charge quantity of the sensor block 11 between two steps for example by changing the voltage value of the substrate bias Vsub according to the operation mode. For example, the substrate bias generator 20 is adapted to generate the substrate bias Vsub having a different voltage value between the frame read mode in which the signal charge is read for each field and every other line and the addition read mode in which the signal charges of n pixels (n≧2) are added in the vertical transfer block 13 to be vertically transferred.

Figure 2:
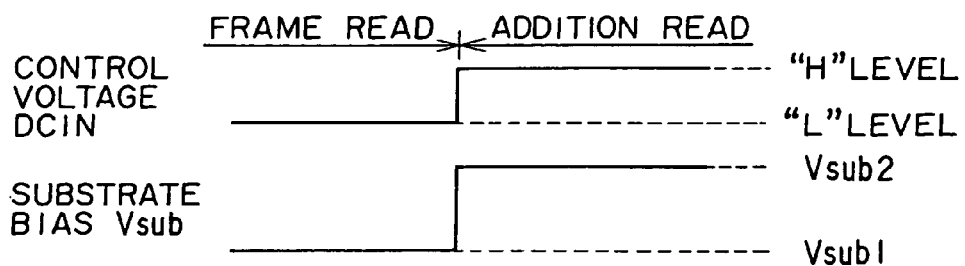
FIG. 2 is a waveform diagram illustrating a relationship between a control voltage DCIN and a substrate bias Vsub applied to a substrate bias generator.

To be specific, as shown in FIG. 2, the substrate bias generator 20 generates a substrate bias Vsub1 in the frame read mode in which the control voltage DCIN goes L level and a substrate bias Vsub2 which is higher in voltage value than the substrate bias Vsub1 in the addition read mode in which the control voltage DCIN goes H level. It should be noted that the voltage value of the substrate bias Vsub1 in the frame read mode is set to an optimum value for each substrate 18 by considering the variations in the overflow barrier potential to be described later in the sensor blocks 11 caused by the variations of individual devices upon fabrication.

On the other hand, the voltage value of the substrate bias Vsub2 in the addition read mode is set to a level in which the saturation signal charge quantity of the sensor block 11 becomes about 1/n of the saturation signal charge quantity in the frame read mode when n pixels of signal charges are added in the vertical transfer block 13. Thus, in the addition read mode, the substrate bias generator 20 generates the substrate bias Vsub2 having a voltage value higher than the substrate bias Vsub1 in the frame read mode, so that the saturation signal charge quantity of the sensor block 11 becomes about 1/n of that in the frame read mode.

Figure 3:
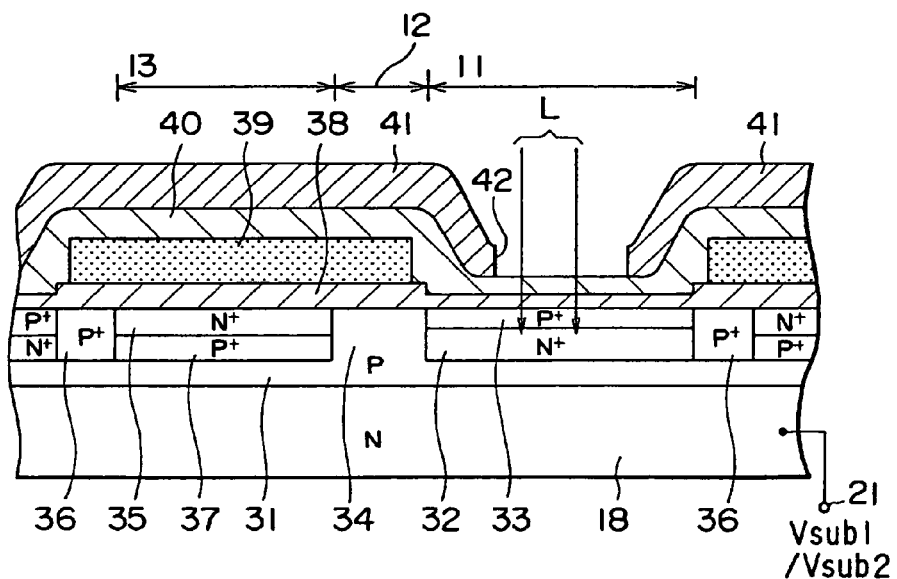
FIG. 3 is a cross section illustrating a structure of surroundings of a sensor block along the depth of the substrate

FIG. 3 shows a cross section of the surroundings of the sensor block 11 along the substrate depth direction. As shown, a P well region 31 is formed on a surface of the N substrate 18 for example. An N+signal charge storage region 32 is formed on a surface of this well region 31. P+positive hole storage region 33 is formed further on this N+signal charge storage region 32. Thus, the sensor block 11 having a so-called HAD (Hole Accumulation Diode) structure is configured.

Figure 4:
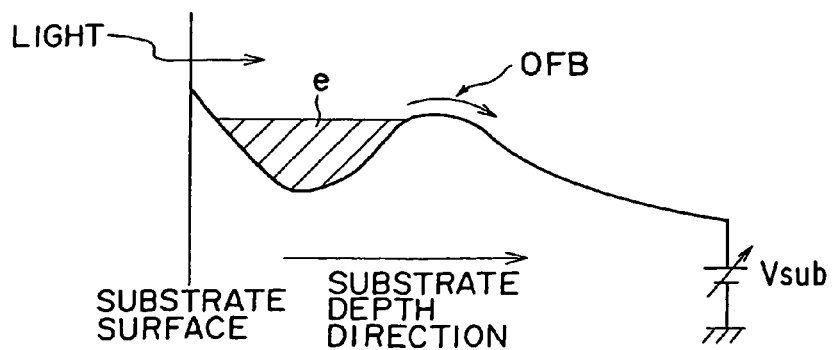
FIG. 4 is a graph illustrating a potential along the depth of the substrate in the surroundings of the sensor block.

The charge quantity of signal charge e to be stored in the sensor block 11 is determined as shown in the potential distribution of FIG. 4 by the height of the potential barrier of an overflow barrier OFB formed by the P well region 31. Namely, the overflow barrier OFB determines a saturation signal charge quantity Qs to be stored in the sensor block 11. When the stored charge quantity exceeds this saturation signal charge quantity Qs, the excess charge is discharged to the substrate 18 side over the potential barrier.

Thus, the sensor block 11 of a so-called vertical overflow drain structure is configured. In the vertical overflow drain structure, the substrate 18 provides an overflow drain. In this sensor block 11, the saturation signal charge quantity Qs is determined by the device's S/N characteristic and the handling charge quantity of the vertical transfer block 13, and the potential of overflow barrier OFB being varied due to variations upon fabrication.

This potential of the overflow barrier QFB is determined by the voltage value of the above-mentioned substrate bias Vsub. In other words, the saturation signal charge quantity Qs of the sensor block 11 is determined by the voltage value of the substrate bias Vsub. Therefore, as described, in the addition read operation mode, the voltage value of the substrate bias Vsub2 exceeds that in the frame read operation mode, thereby deepening the potential of the overflow barrier OFB by the excess amount. Consequently, the saturation signal charge quantity Qs of the sensor block 11 becomes about 1/n of that in the frame read mode.

In the lateral direction of the sensor block 11, an N+ signal charge transfer region 35 and a P+ channel stopper region 36 are arranged via a P region 34 that constitutes the read gate block 12. Below the N+ signal charge transfer region 35, a P+ impurity diffusion region 37 for preventing smear component from mixing is arranged. Further, above the N+ signal charge transfer region 35, a transfer electrode 39 consisting of polysilicon for example is arranged via a gate insulation film 38, forming the vertical transfer block 13. A portion of the transfer electrode 39 which is located above the P region 34 also serves as the gate electrode of the read gate block 12.

Above the vertical transfer block 13, an Al (aluminum) light blocking film 41 is formed via an interlayer film 40, covering the transfer electrode 39. This Al light blocking film 41 is selectively removed by etching in the sensor block 11. External light L enters the sensor block 11 through an opening 42 formed by this removal by etching. The substrate bias Vsub (Vsub1/Vsub2) determining the saturation signal charge quantity Qs of the sensor block 11 is applied to the substrate 18 through the terminal 21.

The following describes the operations of the solid-state imaging apparatus according to the first preferred embodiment in various operation modes.

FIRST SPECIFIC EXAMPLE

Figure 5:
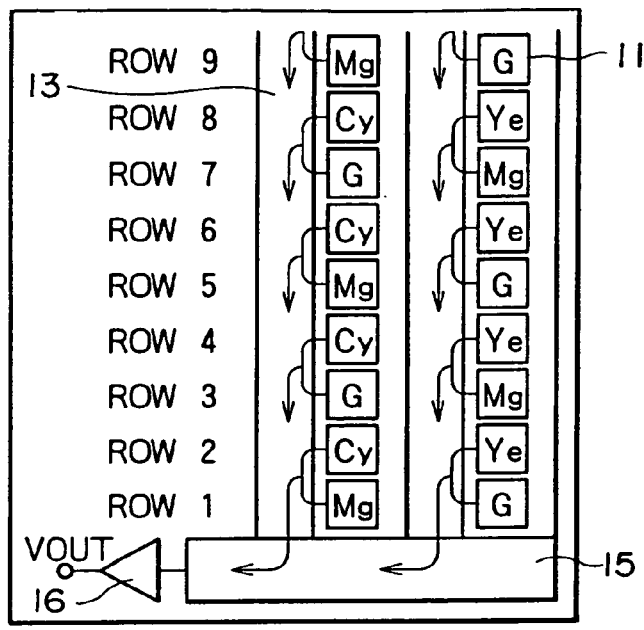
FIG. 5 is a schematic diagram illustrating a first specific example of the first preferred embodiment.

The solid-state imaging apparatus according to the first specific example uses, as the CCD imaging device 10 shown in FIG. 1, a CCD imaging device having color filters of 2 by 4 arrays of complementary colors (for example, Mg (magenta), Cy (cyan), G (green), and Ye (yellow)) as shown in FIG. 5 in order to permit color separation. For simplicity, this example uses a pixel array of 2 columns by 9 rows.

The CCD imaging device 10 is set to the frame read mode in which the signal charges of the pixels on odd-number line and even-number line are alternately read for each field or the addition read mode in which the signal charges read from the pixels are added for 2 pixels for example in the vertical transfer block 13 to be vertically transferred. These modes are set by the timing signals generated by the timing generator 19.

When the frame read mode is set, an L level control voltage DCIN (refer to FIG. 2) is applied to the substrate bias generator 20 as shown in FIG. 1. Then, considering the variation in the overflow barrier potential in the sensor block 11, the substrate bias generator 20 generates the substrate bias Vsub1 set to an optimum level for each substrate 18. The generated substrate bias Vsub1 is applied to the substrate 18 through the terminal 21.

Thus, with the substrate 18 biased with the substrate bias Vsub1, a frame read operation is executed for realizing the still picture mode. Namely, the signal charges of the pixels on odd-number line and even-number line are alternately read for each field and each of the alternately read signal charges is independently transferred in the vertical direction and then in the horizontal direction. This frame read operation is already known, so that its details will be omitted from the following description.

When the addition read mode is set, an H level control voltage DCIN (refer to FIG. 2) is applied to the substrate bias generator 20. The substrate bias generator 20 generates the substrate bias Vsub2 having a voltage value corresponding to the 2-pixel addition in the vertical transfer block 13. The generated substrate bias Vsub2 is applied to the substrate 18 through the terminal 21. Thus, biasing the substrate 18 by the above-mentioned substrate bias Vsub2 having the voltage value corresponding to that of the 2-pixel addition sets the saturation signal charge quantity of the sensor block 11 in the addition read mode to about ½ of the saturation signal charge amount in the frame read mode.

Now, the operation in this addition read mode will be described with reference to the timing charts in FIGS. 6 and 7. These figures show the vertical and horizontal synchronization timings of 4-phase vertical transfer clocks φV1 through φV4, respectively.

Figure 6:
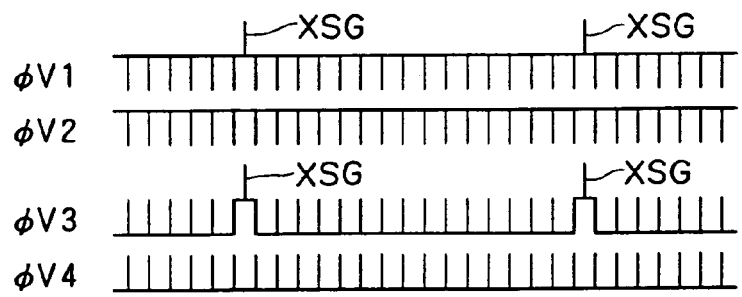
FIG. 6 is a timing chart illustrating vertical synchronization in the first specific example.

Referring to FIG. 6, an H level read pulse XSG is set up on the first-phase and third-phase vertical transfer clocks φV1 and φV3 with a certain timing in a vertical blanking period, thereby causing the signal charges of all sensor blocks 11 to be read by the vertical transfer block 13 and adding the signal charges between the 2 pixels adjacent in row direction inside the vertical transfer block 13. To be specific, as seen from the FIG. 5, the 2-pixel additions of signal charges are executed inside the vertical transfer block 13 between the pixels of row 1 and row 2, row 3 and row 4, row 5 and row 6, and so on.

Figure 7:
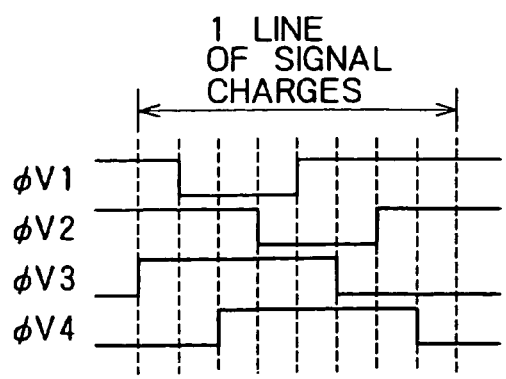
FIG. 7 is a timing chart illustrating horizontal synchronization in the first specific example of the first preferred embodiment.

Then, the 2-pixel added signal charges for 2 rows are vertically transferred (or line-shifted) as 1 line of signal charges during a horizontal blanking period in a timing relation among the 4-phase vertical transfer clocks φV1 through φV4 shown in FIG. 7. This transfers the signal charges, line by line, from the vertical transfer block 13 to the horizontal transfer block 15. Then, 1 line of signal charges is sequentially horizontally transferred by the horizontal transfer block 15 and converted by the charge voltage converter 16 into a signal voltage to be outputted as a CCD output VOUT.

As described, in the solid-state imaging apparatus having the CCD imaging device 10 that can be operated in the two operation modes of the frame read mode and the addition read mode, the signal charges read from the sensor block 11 are added for 2 pixels for example in the vertical transfer block 13 and then the added signal charges are vertically transferred in the addition read mode. This halves the number of output lines without adding the signal charges as compared with that obtained in independent vertical transfer, thereby doubling the frame rate compared with that in the frame read mode. This also can output the information about all pixels, thereby enhancing picture quality and sensitivity.

Further, in the addition read mode, the saturation signal charge quantity of the sensor block 11 is set to about a half of that of the frame read mode. Therefore, the quantity of the signal charges read in the frame read mode is made equal to the signal charges for 2 pixels added in the vertical transfer block 13. This prevents the signal charges from overflowing in the vertical transfer block 13 and the horizontal transfer block 15 due to the 2-pixel addition, even if the sensor block 11 is fully or nearly saturated.

Still further, because the CCD imaging device 10 is configured so simple that, without making any structural change, the substrate bias Vsub to be applied to the substrate 18 is only switched according to the operation mode, the saturation signal charge quantity in the frame read mode remains unchanged from the related art quantity, thereby providing substantially the same picture quality as that obtained in the related art still picture imaging by the frame read operation.

In the above-mentioned first specific example, the 2-pixel addition is executed in the vertical transfer block 13 in the addition read mode. However, the pixel addition is not limited to the 2-pixel addition; the charges for 3 or more pixels can be added in the vertical transfer block 13. In this case, if the number of pixels to be added is n (n≧=2), setting the saturation signal charge quantity of the sensor block 11 determined by the substrate bias Vsub2 generated by the substrate bias generator 20 to about 1/n of the saturation signal charge quantity in the frame read mode can prevent the signal charge overflow due to the pixel addition from occurring in the vertical transfer block 13 and the horizontal transfer block 15.

In the first specific example, the signal charges are added only in the vertical transfer block 13. It will be apparent that the first specific example may also be configured as to perform line-addition on the signal charges in the horizontal transfer block 15, in addition to the pixel-addition in the vertical transfer block 13. The following describes a second specific example of the addition read operation where 2-pixel are added in the vertical transfer block 13 and 2-line are added in the horizontal transfer block 15.

SECOND SPECIFIC EXAMPLE

Figure 8:
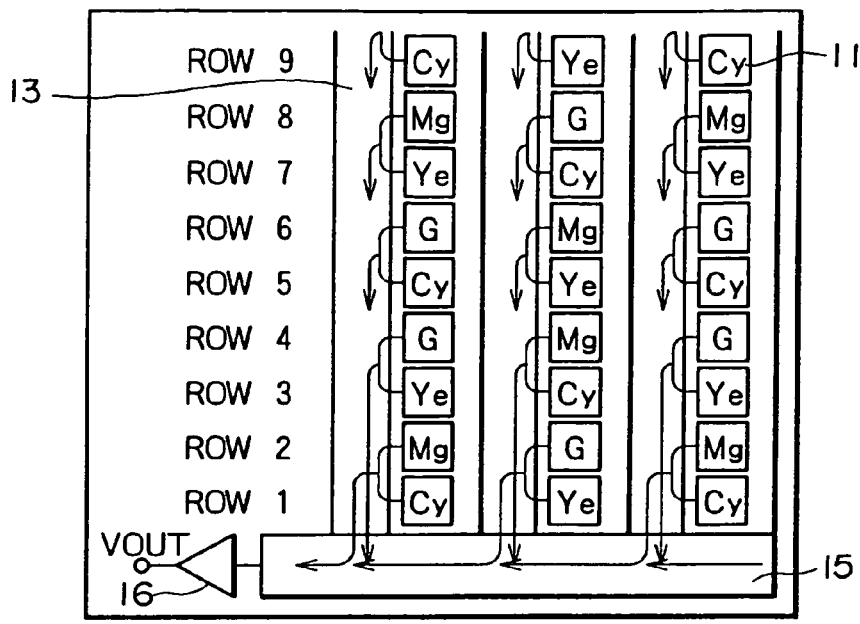
FIG. 8 is a schematic diagram illustrating a configuration of a second specific example of the first preferred embodiment.

A solid-state imaging apparatus according to the second specific example uses a CCD imaging device having color filters of 2 by 8 arrays of complementary colors as shown in FIG. 8 as the CCD imaging device shown in FIG. 1 in order to permit color separation. For simplicity, an pixel array of 3 columns by 9 rows is used for example.

When the addition read mode is set, an H level control voltage DCIN (refer to FIG. 2) is applied to the substrate bias generator 20. Then, the substrate bias generator 20 generates the substrate bias Vsub2 having a voltage value corresponding to the number of pixels to be added. In the second specific example, 2 pixels of signal charges are added in the vertical transfer block 13 and 2 lines (=2 pixels) of signal charges are added in the horizontal transfer block 15. Consequently, the voltage value of the substrate bias Vsub2 corresponding to the addition of 4 (=2×2) pixels of signal charges is set.

The substrate 18 is biased by the substrate bias Vsub2 having the voltage value corresponding to the addition of a total of 4 pixels of signal charges in the vertical transfer block 13 and the horizontal transfer block 15, thereby setting the saturation signal charge quantity of the sensor block 11 in this addition read mode to about ¼ of the saturation signal charge quantity in the frame read mode.

Figure 9:
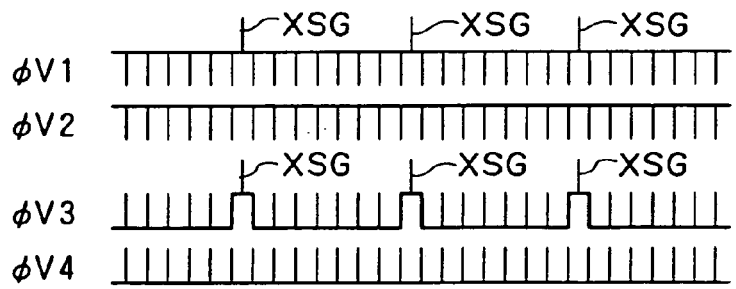
FIG. 9 is a timing chart illustrating vertical synchronization of the second specific example of the first preferred embodiment.
Figure 10:
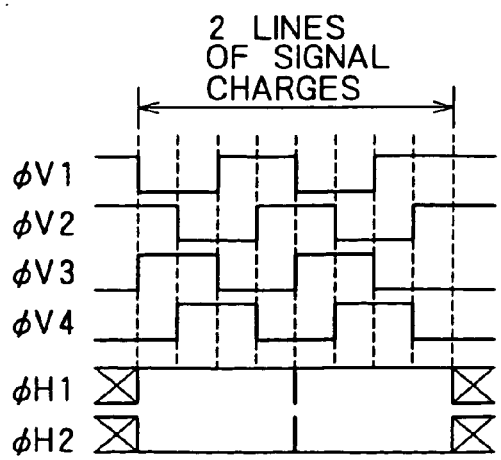
FIG. 10 is a timing chart illustrating horizontal synchronization of the second specific example of the first preferred embodiment.

Now, the operation to be executed in the addition read mode in which 2-pixel addition is executed in the vertical transfer block 13 and 2-line addition is executed in the horizontal transfer block 15 will be described with reference to the timing charts shown in FIGS. 9 and 10. FIG. 9 shows a vertical synchronization timing of 4-phase vertical transfer clocks $\phi V1$ through $\phi V4$. FIG. 10 shows a horizontal synchronization timing of these clocks.

Referring to the timing chart of FIG. 9, an H level read pulse XSG is set up on the first-phase and third-phase vertical transfer clocks $\phi V1$ and $\phi V3$ with a certain timing in a vertical blanking period, thereby causing the signal charges of all sensor blocks 11 to be read by the vertical transfer block 13 and adding the signal charges between the 2 pixels adjacent in the row direction inside the vertical transfer block 13. To be specific, as seen from the FIG. 8, the 2-pixel additions of signal charges are executed inside the vertical transfer block 13 between the pixels of a row 1 and a row 2, a row 3 and a row 4, a row 5 and a row 6, and so on.

Then, the 2-pixel added signal charges for 2 rows are vertically transferred as 1 line of signal charges during a horizontal blanking period in a timing relation among the 4-phase vertical transfer clocks $\phi V1$ through $\phi V4$ shown in FIG. 10. This continuously transfers the 2 lines of the signal charges from the vertical transfer block 13 to the horizontal transfer block 15.

When the 2 lines of signal charges are transferred from the vertical transfer block 13 to the horizontal transfer block 15, 1 clock of 2-phase horizontal transfer clocks $\phi H1$ and $\phi H2$ are outputted immediately after the transfer of the first 1 line of signal charges as seen from the timing chart of FIG. 10, thereby executing 1 the horizontal transfer for 1 packet (hereafter referred to as 1-bit shift) in the horizontal transfer block 15. After this 1-bit shift operation, the following 1 line of signal charges are transferred from the vertical transfer block 13 to the horizontal transfer block 15.

Thus, in signal charge transfer from the vertical transfer block 13 to the horizontal transfer block 15, the 1-bit shift operation is executed in the horizontal transfer block 15 immediately after the transfer of the first 1 line of signal charges and then the following 1 line of signal charges are transferred. Consequently, as seen from FIG. 8, addition between the signal charges in the diagonal direction in the upper and lower 2 lines, namely between the signal charges of the same color is performed. Then, the added signal charges are horizontally transferred sequentially by the horizontal transfer block 15 to be converted by the charge voltage converter 16 into a signal voltage, which is outputted as a CCD output VOUT.

As described, in the solid-state imaging apparatus having the CCD imaging device 10 that can be operated in the 2 operation modes of the frame read mode and the addition read mode, 2 pixels of signal charges for example are added in the vertical transfer block 13 in the addition read mode and then 2 lines of signal charges are added in the horizontal transfer block 15. Consequently, the number of output lines becomes ¼ of that in the case where the signal charges are independently transferred without being added, resulting in a frame rate 4 times as high as that of the frame read mode. This configuration can output the information of all pixels, resulting in enhanced picture quality and sensitivity.

Further, in the addition read mode, the saturation signal charge quantity of the sensor block 11 is set to about ¼ of the saturation signal charge quantity of the frame read mode. This makes the quantity in the signal charges read in the frame read mode equal to the quantity of signal charges for 4 pixels added in the vertical transfer block 13 and the horizontal transfer block 15. Consequently, even if the sensor block 11 is fully or nearly saturated, the signal charge overflow due to the vertical 2-pixel addition and the horizontal 2-line addition can be prevented from occurring in the vertical transfer block 13 and the horizontal transfer block 15.

As seen from the comparison between the timing charts of FIG. 7 and FIG. 10, the 2-line addition in the horizontal transfer block 15 requires to double the frequency of the 4-phase vertical transfer clocks $\phi V1$ through $\phi V4$. However, the combination with the pixel addition in the vertical transfer block 13 requires only the frequency of the vertical transfer clocks $\phi V1$ through $\phi V4$ which are a half of those in the case where the frame rate is raised only by the line addition in the horizontal transfer block 15.

Namely, assume that the frame rate be raised 4 times for example. If the frame rate is raised only by the line addition in the horizontal transfer block 15, 4 lines of signal charges are added in a limited horizontal blanking period, thereby requiring to raise 4 times as higher the frequency of the vertical transfer clocks $\phi V1$ through $\phi V4$. When the pixel addition in the vertical transfer block 13 and the line addition in the horizontal transfer block 15 are combined, only raising twice as higher the frequency of the vertical transfer clocks $\phi V1$ through $\phi V4$ can raise the frame rate by a factor of 4.

In the above-mentioned second specific example, the 2-pixel addition is executed in the vertical transfer block 13 and the 2-line addition is executed in the horizontal transfer block 15 in the addition read mode. It will be apparent that the additions are not limited to those combination of 2 pixels and between 2 lines. Signal charges can be added in combination of 3 or more pixels and 3 or more lines. In this case, if the number of pixels to be vertically added is n ($n \geq 2$) and the number of lines to be horizontally added is m ($m \geq 2$), setting the saturation signal charge quantity to be determined by the substrate bias vsub2 generated by the substrate bias generator 20 to about $1/(n \times m)$ of the saturation signal charge quantity in the frame read mode can prevent signal charge overflow due to the pixel addition from occurring in the vertical transfer block 13 and the horizontal transfer block 15.

Figure 11:
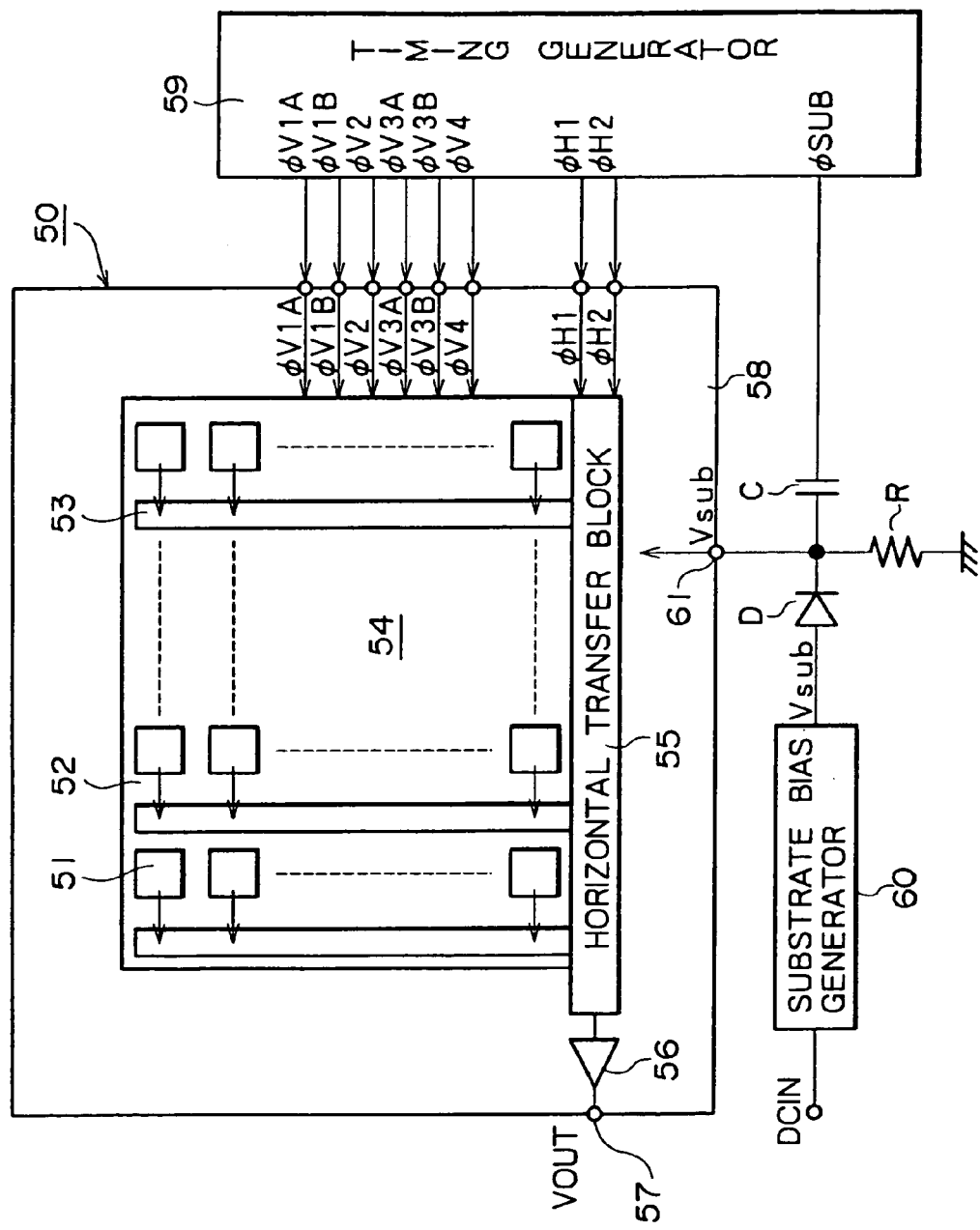
FIG. 11 is a schematic diagram illustrating a configuration of a solid-state imaging apparatus according to a second preferred embodiment.

FIG. 11 schematically shows a configuration of a solid-state imaging apparatus according to a second preferred embodiment of the invention. The following descriptions uses an example in which a CCD imaging device of IT (Interline Transfer) type is used.

As shown in FIG. 11, an imaging area 54 is composed of a plurality of sensor blocks 51 arranged in a matrix for converting an incident light into a signal charge of a quantity corresponding to the quantity of the incident light and a plurality of CCD-based vertical transfer blocks 53 arranged for each row of the plurality of sensor blocks 51 for vertically transferring the signal charges read from the plurality of sensor blocks 51 through a plurality of gate blocks 52.

In this imaging area 54, each of the sensor blocks 51 is constituted by a PN photo diode. The signal charges stored in the sensor block 51 are read by the vertical transfer block 53 when a read pulse XSG is applied to the read gate 52. The vertical transfer block 53 is driven for transfer by 4-phase vertical transfer clocks $\phi V1$ through $\phi V4$ to transfer the read signal charges in the vertical direction sequentially in parts corresponding to one scan line (or one line) within a horizontal blanking period.

In the vertical transfer block 53, like the first preferred embodiment, first-phase and third-phase transfer electrodes also function as a gate electrode of the read gate block 52. Therefore, of the 4-phase vertical transfer clocks $\phi V1$ through $\phi V4$, the first-phase transfer clock $\phi V1$ and the third-phase transfer clock $\phi V3$ are set to take three values of a low level (L) a middle level (M), and a high level (H). A pulse of this high level provides the above-mentioned XSG pulse for reading the read gate block 52.

Below the imaging area 54 in the figure, a CCD-based horizontal transfer block 55 is arranged. To this horizontal transfer block 55, one line of signal charges are sequentially supplied from the plurality of vertical transfer blocks 53. The horizontal transfer block 55 is driven for transfer by 2-phase horizontal transfer clocks $\phi H1$ and $\phi H2$ for example, sequentially transferring one line of signal charges supplied from the plurality of vertical transfer blocks 53, in the horizontal direction within a horizontal scan period after the horizontal blanking period.

The horizontal transfer block 55 is arranged at the end of the transfer destination side thereof with a charge voltage converter 56 of floating diffusion amplifier configuration for example. This charge voltage converter 56 sequentially converts the signal charges supplied from the horizontal transfer block 55 into a signal voltage and outputs it. This signal voltage is outputted from an output terminal 57 as a CCD output VOUT that corresponds to the quantity of the incident light radiated from an imaging subject.

The above-mentioned sensor block 51, read gate block 52, vertical transfer block 53, horizontal transfer block 55, and charge voltage converter 56 are formed on a semiconductor substrate 58. Thus, a CCD imaging device 50 of interline transfer type is configured.

The above-mentioned vertical transfer clocks $\phi V1$ through $\phi V4$ and horizontal clocks $\phi H1$ and $\phi H2$ for driving this CCD imaging device 50 are generated by a timing generator 59. This timing generator 59 functions as a driving means for driving the CCD imaging device 50. Of the vertical transfer clocks $\phi V1$ through $\phi V4$, 2 lines of vertical transfer clocks $\phi V1A$ and $\phi V1B$ and $\phi V3A$ and $\phi V3B$ for example are generated for the first-phase and third-phase vertical transfer clocks $\phi V1$ and $\phi V3$ in order to realize a thinning-out read operation to be described later.

Figure 12:
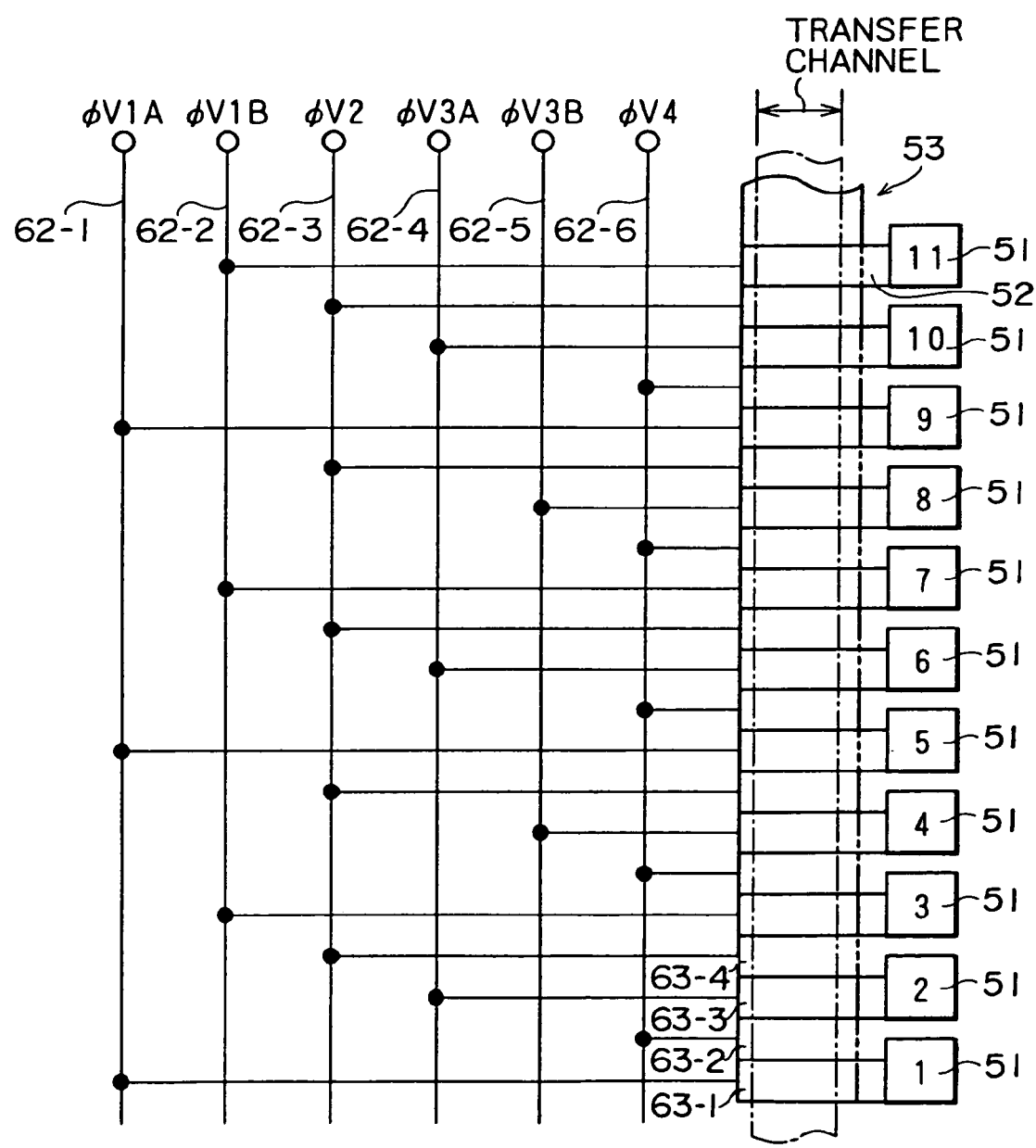
FIG. 12 is a diagram illustrating one example of a wiring pattern of a transmission system of a vertical transfer clock for implementing a line thinning-out operation.

FIG. 12 shows an example of a wiring pattern of transfer electrodes in the vertical transfer block 53 for realizing a thinning-out read operation. In the row (vertical) direction, 4 pixels provide an iterative unit. If a signal charge is read in the first 2 pixels and no signal charge is read in the following 2 pixels, 2 lines are thinned out for every 2 lines. In this example, this 2-line thinning-out read operation for every 2 lines is used.

As shown in FIG. 12, a total of 6 bus lines 62-1 through 62-6 are wired in order to transmit the vertical transfer clocks $\phi V1A$, $\phi V1B$, $\phi V2$, $\phi V3A$, $\phi V3B$, and $\phi V4$. The bus line 62-1 for transmitting the vertical transfer clock $\phi V1A$ is connected to a first-phase transfer electrode 63-1 for every 3 pixels. The bus line 62-2 for transmitting the vertical transfer clock $\phi V1B$ is connected to a first-phase transfer electrode 24-1 other than those connected to the bus line 62-1 for every 3 pixels. The bus line 62-3 for transmitting the vertical transfer clock $\phi V2$ is connected to the fourth-phase transfer electrode 63-4 for every other pixel.

The bus line 62-4 for transmitting the vertical transfer clock $\phi V3A$ is connected to a third-phase transfer electrode 63-3 for every 3 pixels. The bus line 62-5 for transmitting the vertical transfer clock $\phi V3B$ is connected to a third-phase transfer electrode 63-3 other than those connected to the bus line 62-4 for every 3 pixels. The bus line 62-6 for transmitting the vertical transfer clock $\phi V4$ is connected to a second-phase transfer electrode 24-2 for every other pixel.

Figure 13A:
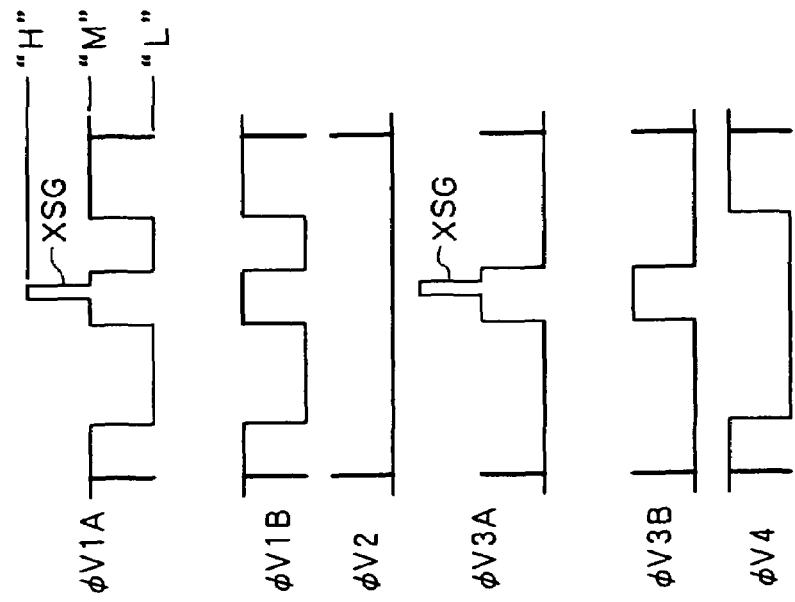
FIGS. 13A and 13B are read pulse XSG waveform diagrams illustrating a frame read operation mode and a line thinning-out operation mode, respectively.
Figure 13B:
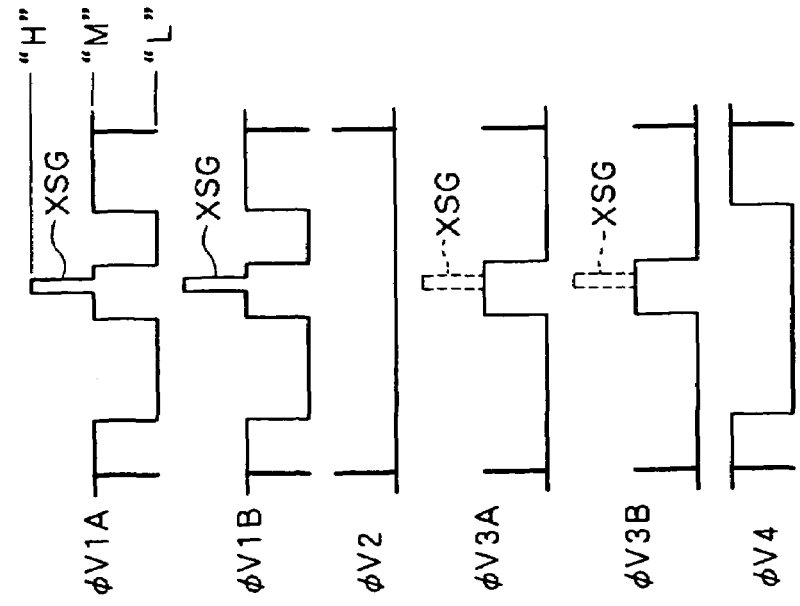

As described, with the vertical transfer clocks $\phi$ V1A/$\phi$V1B and $\phi$V3A/$\phi$3B, the H level pulse of their third value provides a read pulse XSG for driving the read gate block 52 when reading signal charges from the sensor block 51. In a frame read operation, the read pulse XSG is set up for each of the vertical transfer clocks $\phi V1A/\phi V1B$ and $\phi V3A/\phi V3B$ as shown in FIG. 13A. In a line thinning-out operation, the read pulse XSG is set up for only the vertical transfer clocks $\phi V1A$ and $\phi V3A$ as shown in FIG. 13B.

Referring to FIG. 11 again, in addition to the above-mentioned vertical transfer clocks $\phi V1(A/B)$, $\phi V2$, $\phi V3(A/B)$, and $\phi V4$ and the horizontal transfer clocks $\phi H1$ and $\phi H2$, the timing generator 59 is configured to generate appropriately various timing signals such as a shutter pulse $\phi SUB$ which is applied to the substrate 58 in order to discharge at once the signal charges stored in all sensor blocks 51 in the electronic shutter mode.

The substrate 58 is externally connected with a substrate bias generator 60 for generating a bias voltage Vsub for biasing the substrate 58. The substrate bias Vsub generated by the substrate bias generator 60 is applied to the substrate 58 through a diode D and a terminal 61. The voltage value of this substrate bias Vsub determines the saturation signal charge quantity of the sensor block 51 of the CCD imaging device 50. This determination is made in the same manner as described with the solid-state imaging apparatus according to the first preferred embodiment.

The shutter pulse $\phi SUB$ generated by the timing generator 59 is DC-cut by a capacitor C and the resultant pulse is applied to the substrate 58 through the terminal 61. A resistor R is inserted between the terminal 61 and ground. It should be noted that the diode D clamps the L level of the shutter pulse $\phi SUB$ to the DC level of the substrate bias Vsub.

The present example uses a configuration in which the substrate bias generator 60 is arranged outside the substrate 58. It will be apparent to those skilled in the art that the substrate bias generator 60 may be formed on the substrate 18 along with the diode D.

The substrate bias generator 60 functions as a saturation signal charge quantity setting means for switching the saturation signal charge quantity of the sensor block 51 between two steps for example by changing the voltage value of the substrate bias Vsub according to the operation mode. That is, the substrate bias generator 60 generates the substrate bias Vsub having a different voltage value between the frame read mode and a special read mode.

The special read mode herein denotes an operation mode obtained by combining the line thinning-out operation in which the read pulse XSG is applied to the read gate block 52 for every predetermined iterative unit to read the signal charges of the pixels of only some of the lines and an addition read operation in which the n (n≧2) pixels of signal charges in at least one of the vertical transfer block 53 and the horizontal transfer block 55.

To be more specific, the substrate bias generator 60 generates a substrate bias Vsub1 in the frame read mode in which the control voltage DCIN goes L level and a substrate bias Vsub2 which is higher in voltage value than the substrate bias Vsub1 of the special read mode in which the control voltage DCIN goes H level. It should be noted that the voltage value of the substrate bias Vsub1 in the frame read mode is set to an optimum value for each substrate 58 by considering the variations in the overflow barrier potential to be described later in the sensor blocks 51 caused by the variations in the individual devices upon fabrication.

The voltage value of the substrate bias Vsub2 in the special read mode is set so that the saturation signal charge quantity in the sensor block 51 becomes about 1/N of the saturation signal charge quantity of the frame read mode if N (N≧2) pixels of signal charges are added in at least one of the vertical transfer block 53 and the horizontal transfer block 55. Thus, in the special read mode, the substrate bias generator 60 generates the substrate bias Vsub2 having a voltage value higher than that of the substrate bias Vsub1 in the frame read mode, thereby setting the saturation signal charge quantity of the sensor block 51 to about 1/N of that of frame read mode.

The following describes the operation in the special read mode in the above-mentioned solid-state imaging apparatus according to the second preferred embodiment.

FIRST SPECIFIC EXAMPLE

Figure 14:
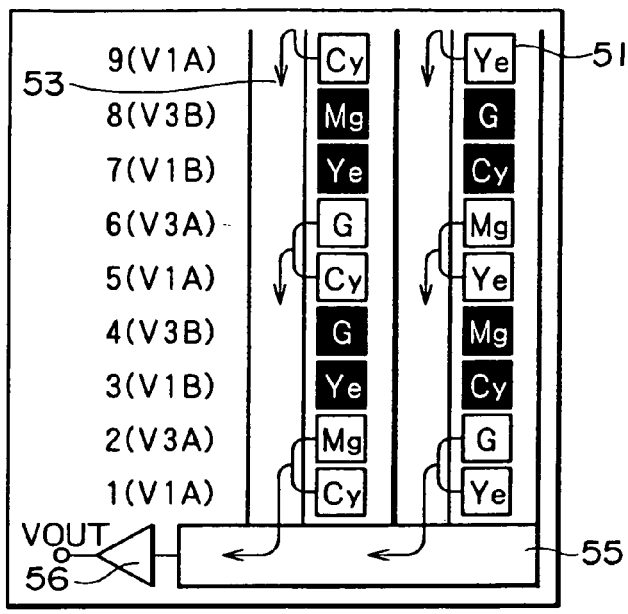
FIG. 14 is a schematic diagram illustrating a configuration of a first specific example of the second preferred embodiment.

The solid-state imaging apparatus according to the first specific example of the second preferred embodiment uses a CCD imaging device having color filters of 2 by 8 arrays of complementary colors as shown in FIG. 14 as the CCD imaging device 50 shown in FIG. 11 in order to permit color separation. In the special read mode according to the first specific example, an addition read operation for adding 2 pixels for example of signal charges are added in the vertical transfer block 53 is executed in addition to a line thinning-out operation in which 4 pixels for example in the row (vertical) direction provide an iterative unit and the signal charges are read from the sensor block 51 only 2 of every 4 pixels.

When the special read mode is set, an H level control voltage DCIN is applied to the substrate bias generator 60. Then, the substrate bias generator 60 generates the substrate bias Vsub2 having a voltage value corresponding to the number of pixels to be added in the vertical transfer block 53. In this example, 2 pixels of signal charges are added in the vertical transfer block 53, so that the voltage value of the voltage bias Vsub2 is set accordingly.

Thus, biasing the substrate 58 by the substrate bias Vsub2 having the voltage value corresponding to the addition of a total of 2 pixels of signal charges in the vertical transfer block 53 sets the saturation signal charge quantity of the sensor block 51 in this special read mode to about ½ of the saturation signal charge quantity of the frame read mode.

Figure 15:
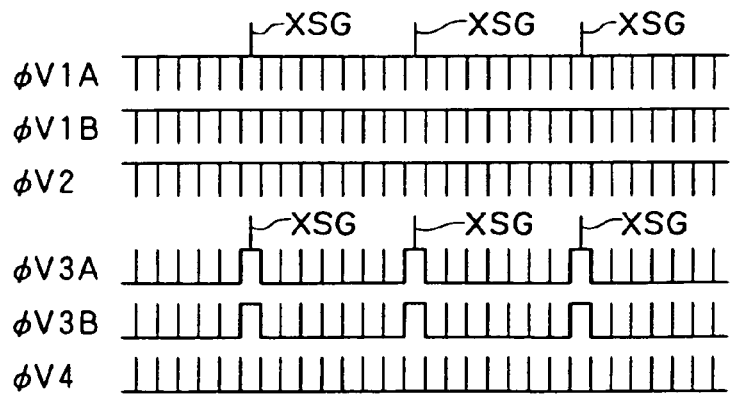
FIG. 15 is a timing chart illustrating vertical synchronization of the first specific example of the second preferred embodiment.
Figure 16:
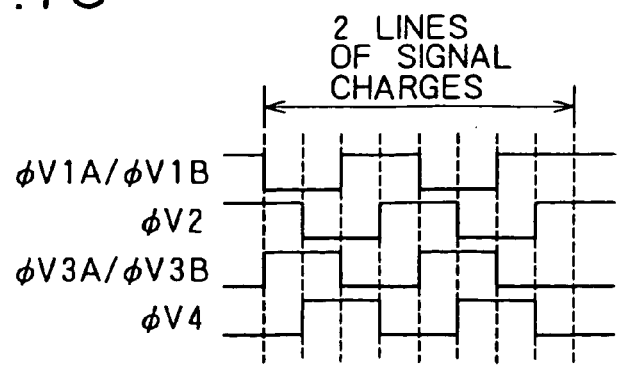
FIG. 16 is a timing chart illustrating horizontal synchronization of the first specific example of the second preferred embodiment.

The following describes the operation in the special read mode in the case where the line thinning-out and the 2-pixel addition in the vertical transfer block 53 are executed in combination, with reference to the timing charts of FIGS. 15 and 16. FIG. 15 shows a vertical synchronization timing of 4-phase vertical transfer clocks φV1(A/B), φV2, φV3(A/B), and φV4. FIG. 16 shows a horizontal synchronization timing of these clocks. Referring to FIG. 14, each pixel is shown with a relationship between the 2 lines of vertical transfer clocks φV1A/φ1B and φV3A/φV3B to be given to each pixel.

Referring to the timing chart shown in FIG. 15, an H level read pulse XSG is set up for the first-phase and third-phase vertical transfer clocks φV1A and φV3A with a certain timing in a vertical blanking period, thereby reading the signal charges of the sensor block 51 for 2 pixels every other 2 pixels in the row direction. This is the line thinning-out operation in this first specific example. Then, the 2 pixels of signal charges read every 2 pixels are added in the vertical transfer block 53.

To be specific, as seen from FIG. 14, the signal charges are read from the sensor block 51 to the vertical transfer block 51 in units of 2 pixels like each pixel on a row 1 and each pixel on a row 2, each pixel on a row 5 and each pixel on a row 6, each pixel on a row 9 and each pixel on row 10, and so on. The signal charges read for every 2 pixels are added in the vertical transfer block 53.

Then, the 2 rows of signal charges added with a 2 pixel basis being 1 line of signal charges, the 2 lines of signal charges are vertically transferred in a horizontal blanking period in a timing relation among the 4-phase vertical transfer clocks φV1(A/B), φV2, φV3(A/B), and φV4 shown in FIG. 16. At this time, the last 1 line has no signal charges because of the line thinning-out operation, so that only 1 line of signal charges are transferred to the horizontal transfer block 55. These 1 line of signal charges are sequentially transferred by the horizontal transfer block 55 to the charge voltage converter 56 to be converted into a signal voltage, which is outputted as a CCD output VOUT.

As described, in the solid-state imaging apparatus having the CCD imaging device 50 that can be operated in the two modes of the frame read mode and the special read mode, when the special read mode is set, the reading of the signal charges for 2 pixels for every other 2 pixels in the row direction is thinned out (line thinning-out operation) and, at the same time, the read signal charges are added for every 2 pixels in the vertical transfer block 53. Consequently, the number of output lines is reduced to ¼ of that obtained by vertically transferring the signal charges independently without thinning-out the signal charges, thereby raising the frame rate by a factor of 4 as compared with that of the frame read mode.

Further, in the special read mode, the saturation signal charge quantity is set to about ½ of the saturation signal charge quantity of the frame read mode. Therefore, the quantity of the signal charges read in the frame read mode is made equal to the 2 pixels of signal charges added in the vertical transfer block 53. This prevents the signal charges from overflowing in the vertical transfer block 53 and the horizontal transfer block 55 due to the 2-pixel addition, even if the sensor block 51 is fully or nearly saturated.

In the addition read operation according to the above-mentioned first specific example, the 2-pixel addition is executed in the vertical transfer block 53. However, the pixel addition is not limited to the 2-pixel addition; the signal charges for 3 or more pixels can be added in the vertical transfer block 53. In this case, if the number of pixels to be added is n (n≧2), setting the saturation signal charge quantity in the sensor block 51 determined by the substrate bias Vsub2 generated by the substrate bias generator 60 to about 1/n of the saturation signal charge quantity in the frame read mode can prevent the signal charge overflow due to the pixel addition from occurring in the vertical transfer block 53 and the horizontal transfer block 55.

SECOND SPECIFIC EXAMPLE

Figure 17:
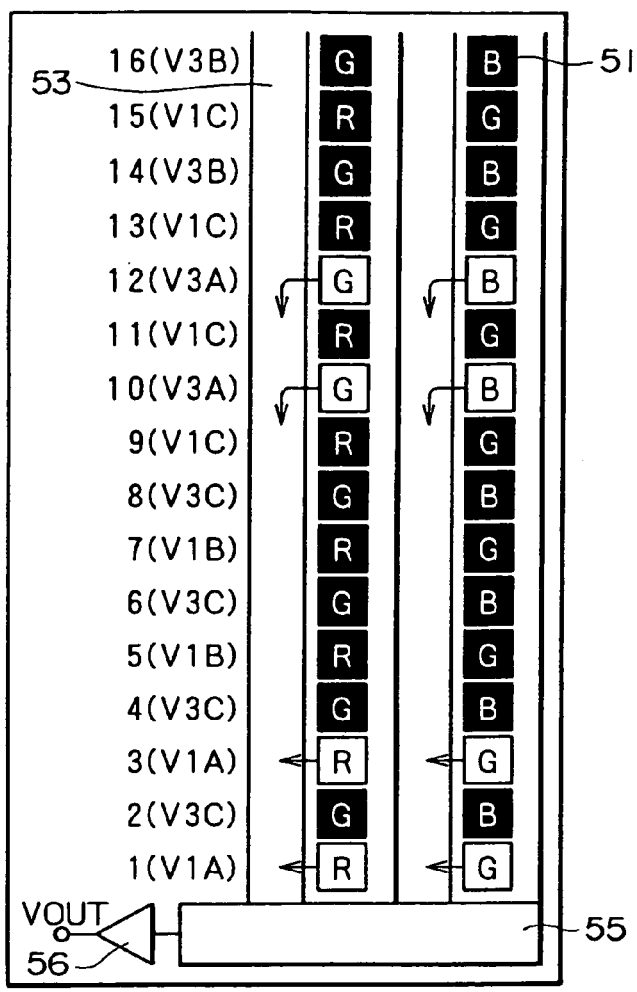
FIG. 17 is a schematic diagram illustrating a configuration of a second specific example of the second preferred embodiment.

The solid-state imaging apparatus according to the second specific example of the second preferred embodiment uses a CCD imaging device having color filters of 2 by 2 arrays of primary colors (R, G, B) as shown in FIG. 17 as the CCD imaging device 50 shown in FIG. 11. In the special read mode according to this second specific example, 16 pixels for example in the row direction provide an iterative unit and signal charges are read from the sensor block 51 only for 4 of every 16 pixels. In other words, in this second specific example, an addition read operation for adding 2 lines of signal charges for example is executed in the horizontal transfer block 55 in addition to a line thinning-out operation in which 12 pixels of signal charges are thinned out of 16 pixels of signal charges.

In the special read mode according to the second specific example, 2 lines (2 pixels) of signal charges are added in the horizontal transfer block 55, so that the voltage value of the substrate bias Vsub2 is set according to the number of added lines. This sets the saturation signal charge quantity of the sensor block 51 in the special read mode to about ½ of the saturation signal charge quantity of the frame read mode.

In order to realize a line thinning-out operation for thinning 12 pixels out of 16 pixels, the timing generator 59 generates 3 lines of vertical transfer clocks $\phi$V1A/$\phi$V1B/$\phi$V1C and $\phi$V3A/$\phi$V3B/$\phi$V3C for the first-phase and third-phase vertical transfer clocks $\phi$V1 and $\phi$V3 of the vertical transfer clocks $\phi$V1 through $\phi$V4.

Figure 18:
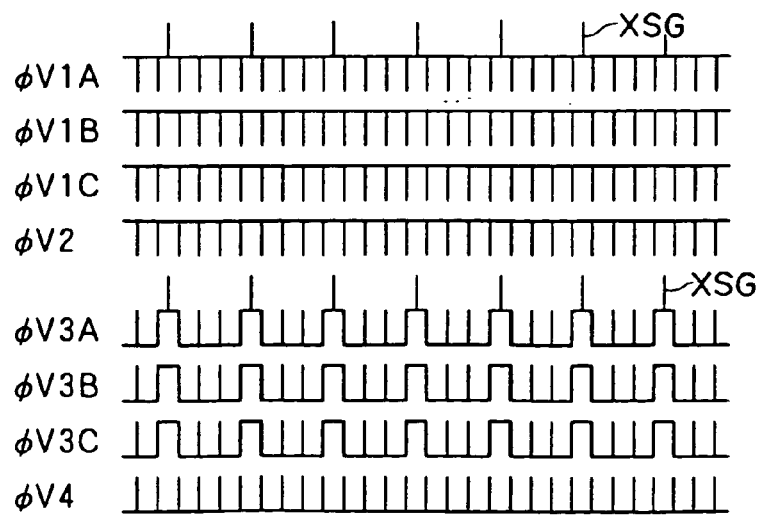
FIG. 18 is a timing chart illustrating vertical synchronization of the second specific example of the second preferred embodiment.
Figure 19:
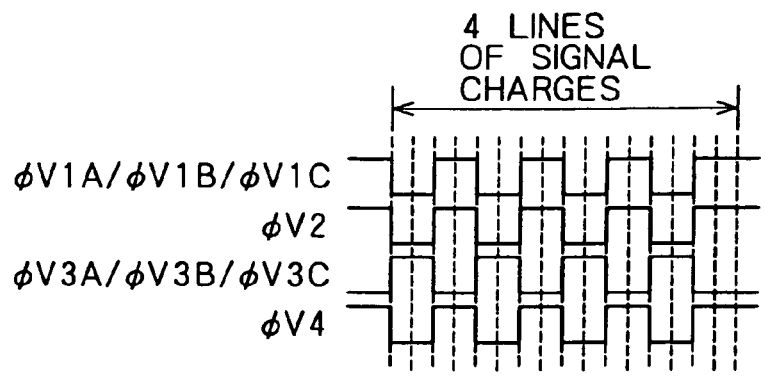
FIG. 19 is a timing chart illustrating horizontal synchronization of the second specific example of the second preferred embodiment.

The following describes the operation in the special read mode in which the above-mentioned line thinning-out operation and the 2-line addition in the horizontal transfer block 52 are executed, with reference to the timing charts shown in FIGS. 18 and 19. FIG. 18 shows a vertical synchronization timing for the 4-phase vertical transfer clocks $\phi$V1(A/B/C), $\phi$V2, $\phi$V3(A/B/C), and $\phi$V4. FIG. 19 shows a horizontal synchronization timing of these clocks.

Referring to FIG. 17, each pixel is shown with a relationship between the 3 lines of vertical transfer clocks $\phi$V1A/$\phi$V1B/$\phi$V1C and $\phi$V3A/$\phi$V3B/$\phi$V3C to be given to each pixel. It should be noted that the transmission system of the vertical transfer clocks $\phi$1(A/B/C), $\phi$V2, $\phi$V3(A/B/C), and $\phi$V4 to the pixels is pattern-wired according to the wiring principles shown in FIG. 12.

Referring to the timing chart shown in FIG. 18, an H level read pulse XSG is set up for the first-phase and third-phase vertical transfer clocks $\phi$V1A and $\phi$V3A with a certain timing in a vertical blanking period, thereby reading the signal charges of the sensor block 51 for only 4 pixels of 16 pixels, which provide an iterative unit, in the row direction. These 4 pixels of signal charges are transferred to the vertical transfer block 53. In other words, 12 pixels of signal charges are thinned out of 16 pixels of signal charges. This is the line thinning-out operation in this second specific example.

To be more specific, as seen from FIG. 17, a row 1 through a row 16 provide an iterative unit and signal charges are read only from the pixels of a row 1, a row 3, a row 10, and a row 12, the pixels of the remaining rows 2, 4 through 9, 11, and 13 through 16 being thinned out. The signal charges thus read are not added in the vertical transfer block 53 but sequentially transferred vertically to the horizontal transfer block 55.

In this signal charge transfer from the vertical transfer block 53 to the horizontal transfer block 55, the signal charges are transferred on a 4-line (row) basis in a timing relation among the 4-phase vertical transfer clocks $\phi$V1(A/B/C), $\phi$V2, $\phi$V3(A/B/C), and $\phi$V4 shown in FIG. 19 in a horizontal blanking period. As for the first 4 lines, only the line 1 and the line 3 have signal charges, so that 2 lines (2 pixels) of signal charges are added in the horizontal transfer block 55. Then, the added signal charges are sequentially transferred horizontally by the horizontal transfer block 55 to the charge voltage converter 56 to be converted into a signal voltage, which is outputted as CCD output VOUT.

As described, in the special read mode, the signal charges of 12 pixels out of every 16 pixels providing an iterative unit in the row direction read from the sensor block 51 are thinned out (a line thinning-out operation) and 2 lines of signal charges thus read are added in the horizontal transfer block 55. Consequently, the number of output lines becomes ⅛ (=⁴⁄₁₆÷2) of that in the operation mode in which signal charges are not thinned out nor added but vertically transferred independently, resulting in a frame rate which is 8 times as high as that in the frame read mode.

Further, in the special read mode, the saturation signal charge quantity of the sensor block 51 is set to about ½ of the saturation signal charge quantity of the frame read mode. This makes the quantity of the signal charges read in the frame read mode equal to the quantity of 2 lines of signal charges added in the horizontal transfer block 55, thereby preventing the signal charge overflow due to the 2-line addition from occurring in the horizontal transfer block 55 even if the sensor block 51 is fully or nearly saturated.

In the addition read operation according to the above-mentioned second specific example, the 2-line addition is executed in the horizontal transfer block 55. However, the line addition is not limited to 2 lines. For example, when reading 4 lines of signal charges from every 16 lines which provide an iterative unit as with the above-mentioned second specific example, the 4 lines of signal charges thus read may be added in the horizontal transfer block 55. In this case, the saturation signal charge quantity in the special read mode may be set to about ¼ of that in the frame read mode.

The number of lines to be added in the horizontal transfer block 55 is not necessarily limited to single. For example, in this line addition mode, 2 or more operation modes in which the number of addition lines is x (x≧2) and y (x>y) may be set for selection. In this case, the substrate bias Vsub2 to be generated by the substrate bias generator 60 may be selected according to each operation mode so that the saturation signal charge quantities in these operation modes become about 1/x and about 1/y in the frame read mode.

THIRD SPECIFIC EXAMPLE

Figure 20:
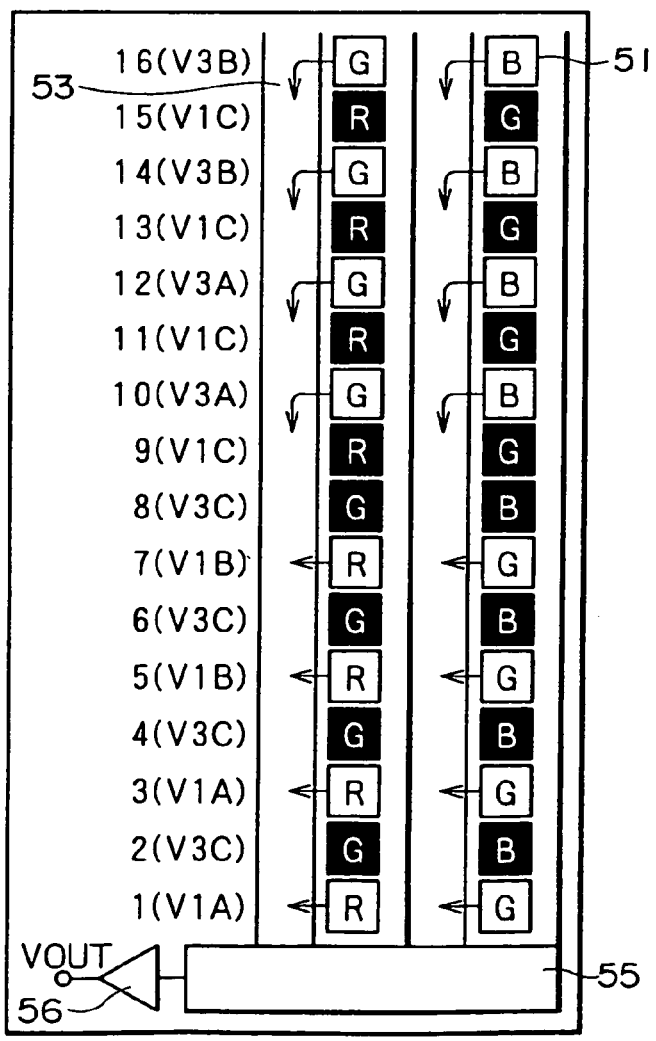
FIG. 20 is a schematic diagram illustrating a configuration of a third specific example of the second preferred embodiment.

The solid-state imaging apparatus according to the third specific example of the second preferred embodiment uses a CCD imaging device having color filters of 2 by 2 arrays of primary colors as shown in FIG. 20 as the CCD imaging device 50 shown in FIG. 11 in order to permit color separation. In the special read mode according to this third specific example, 16 pixels for example in the row direction provide an iterative unit and 8 pixels of signal charges out of every 16 pixels are read from the sensor block 51. In other words, an addition read operation for adding 4 lines for example of signal charges are added in the horizontal transfer block 55 is executed in addition to a line thinning-out operation in which 8 pixels of signal charges are thinned out of every 16 pixels.

In the special read mode according to the above-mentioned third specific example, 4 lines (4 pixels) of signal charges are added in the horizontal transfer block 55, so that the substrate bias Vsub2 is set to a voltage value corresponding to the number of lines to be added. Consequently, the saturation signal charge quantity of the sensor block 51 in the special read mode is set to about ¼ of the saturation signal charge quantity of the frame read mode.

In order to realize the line thinning-out operation for thinning 8 pixels out of every 16 pixels, 3 lines of vertical transfer clocks φV1A/φV1B/φV1C and φV3A/φV3B/φV3C are generated by the timing generator 59 for the first-phase and third-phase vertical transfer clocks φV1 and φV3 of the vertical transfer clocks φV1 through φV4 as with the above-mentioned second specific example.

Figure 21:
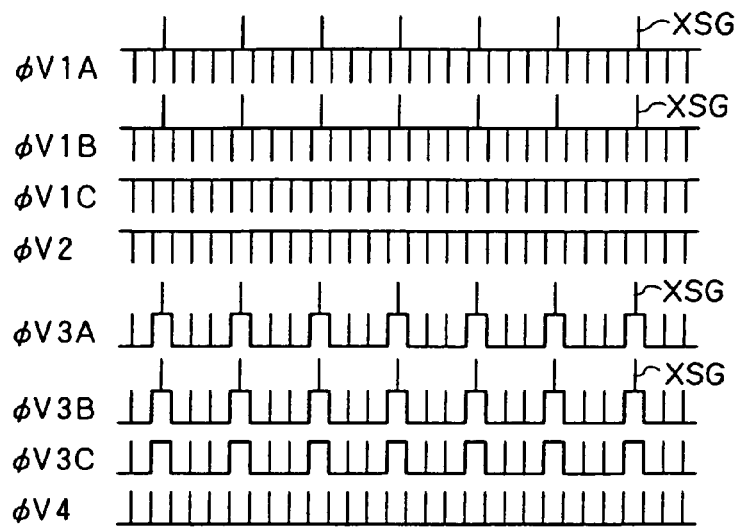
FIG. 21 is a timing chart illustrating vertical synchronization of the third specific example of the second preferred embodiment.
Figure 22:
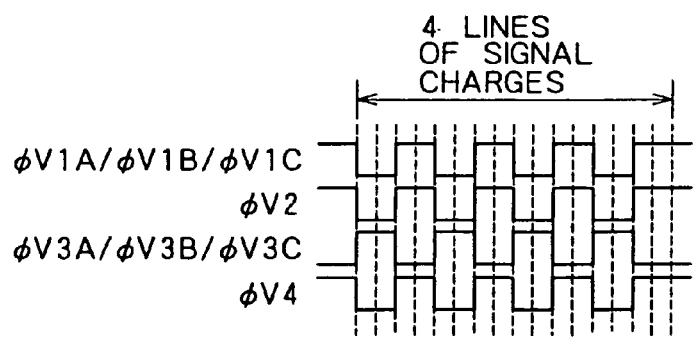
FIG. 22 is a timing chart illustrating horizontal synchronization of the third specific example of the second preferred embodiment.

The following describes the special read mode operation in the case where the above-mentioned line thinning-out operation and the addition of 4 lines in the horizontal transfer block 52 are executed, with reference to the timing charts shown in FIGS. 21 and 22. FIG. 21 shows a vertical synchronization timing of 4-phase vertical transfer clocks φV1(A/B/C), φV2, φV3(A/B/C), and φV4. FIG. 22 shows a horizontal synchronization timing of these clocks.

Referring to FIG. 20, each pixel is shown with a relationship between the 3 lines of vertical transfer clocks φV1A/φV1B/φV1C and φV3A/φV3B/φV3C to be given to each pixel. It should be noted that the transmission system of the vertical transfer clocks φV1(A/B/C), φV2, φV3(A/B/C), and φV4 to the pixels is pattern-wired according to the wiring principles shown in FIG. 12.

Now, referring to the timing chart shown in FIG. 21, an H level read pulse XSG is set up for the first-phase and third-phase vertical transfer clocks φV1A/φV1B and φ V3A/φV3B with a certain timing of a vertical blanking period, thereby reading the signal charges of the sensor block 51 for only 8 pixels of 16 pixels, which provide an iterative unit, in the row direction. These 8 pixels of signal charges are transferred from the sensor block 51 to the vertical transfer block 53. In other words, 8 pixels of signal charges are thinned out of 16 pixels of signal charges. This is the line thinning-out operation in this third specific example.

To be specific, as seen from FIG. 20, with row 1 through row 16 being one unit, the signal charges of the pixels of row 1, row 3, row 5, row 7, row 10, row 12, row 14, and row 16 are read. The signal charges of the remaining pixels of row 2, row 4, row 6, row 8, row 9, row 11, row 13, and row 15 are thinned out. Then, the signal charges thus read are not added in the vertical transfer block 53 but are sequentially transferred vertically to the horizontal transfer block 55.

In the transfer of the signal charges from the vertical transfer block 53 to the horizontal transfer block 55, the signal charges are vertically transferred on a 4-line (4-row) basis in a timing relation of the 4-phase vertical transfer clocks φV1(A/B/C), φV2, φV3(A/B/C), and φV4 shown in FIG. 22 in a horizontal blanking period. Consequently, as for the first 4 lines, every other line has signal charges, so that 4 lines (2 pixels) of signal charges are added in the horizontal transfer block 55. Thereafter, the signal charges are sequentially transferred horizontally to the charge voltage converter 56 to be converted into a signal voltage, which is outputted as CCD output VOUT.

As described, in the special read mode, the signal charges of 8 pixels out of every 16 pixels providing an iterative unit in the row direction read from the sensor block 51 are thinned out (a line thinning-out operation) and 4 lines of signal charges thus read are added in the horizontal transfer block 55. Consequently, the number of output lines becomes ⅛ (=⁸⁄₁₆÷4) as compared with the operation mode in which the signal charges are not thinned out but vertically transferred independently, resulting in a frame rate 8 times as high as that of the frame read mode.

Further, in the special read mode, the saturation signal charge quantity of the sensor block 51 is set to about ¼ of the saturation signal charge quantity of the frame read mode. This makes the quantity of the signal charges read in the frame read mode equal to the quantity of 4 lines of signal charges added in the horizontal transfer block 55, thereby preventing the signal charge overflow due to the 4-line addition in the horizontal transfer block 55 even if the sensor block 51 is fully or nearly saturated.

In the addition read operation according to the above-mentioned third specific example, the 4-line addition is executed in the horizontal transfer block 55. However, the line addition is not limited to 4 lines. For example, when reading 8 lines of signal charges from every 16 lines which provide an iterative unit as with the above-mentioned third specific example, the 8 lines of signal charges thus read may be added in the horizontal transfer block 55. In this case, the saturation signal charge quantity in the special read mode may be set to about ⅛ of that in the frame read mode.

The number of lines to be added in the horizontal transfer block 55 is not necessarily limited to single. For example, in this line addition mode, 2 or more operation modes in which the number of addition lines is x (x≧2) and y (y>x) may be set for selection. In this case, the substrate bias Vsub2 to be generated by the substrate bias generator 60 may be selected according to each operation mode so that the saturation signal charge quantities in these operation modes become about 1/x and about 1/y in the frame read mode.

In the above-described first and second preferred embodiments, the reading scheme in which the signal charges read from the pixels are vertically transferred independently is applied to the CCD imaging device of interlace-compatible frame read operation type. It will be apparent that the reading scheme according to the invention is also applicable to a CCD imaging device of all-pixel reading in which the signal charges of all pixels are read at once and the signal charges thus read are independently transferred.

In the above-described first and second preferred embodiments, the saturation signal charge quantity of the pixels in the pixel addition or line addition mode is set by changing the substrate bias Vsub to that in the normal operation mode in the CCD imaging device having a vertical overflow drain structure (refer to FIG. 3). It will be apparent that the setting of the saturation signal charge quantity is not limited to this configuration.

For example, in a CCD imaging device having a so-called horizontal overflow drain structure in which each pixel has overflow drain, the saturation signal charge quantity of the pixels in the pixel addition or line addition mode can be set by changing the DC bias for determining the potential of the overflow barrier of each pixel according to the operation mode.

If the operation mode in which the addition operation is executed only in the horizontal transfer block is employed, the overflow drain may be arranged at one side of a transfer channel for each vertical transfer block in the V-to-H transfer area for transferring signal charges from the vertical transfer block to the horizontal transfer block, thereby determining the potential of that overflow barrier by DC bias. The saturation signal charge quantity of the pixels in the line-addition operation may be set by changing this DC bias according to the operation mode.

Figure 23:
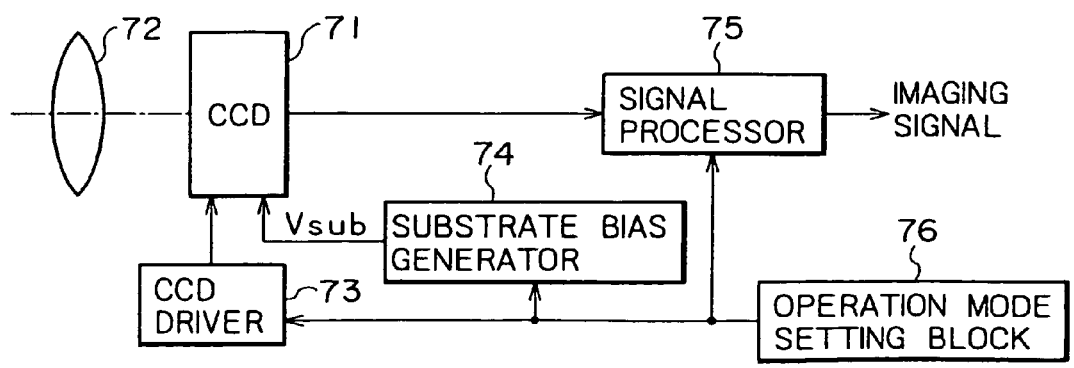
FIG. 23 is a block diagram illustrating one example of a camera system according to the invention.
Figure 24:
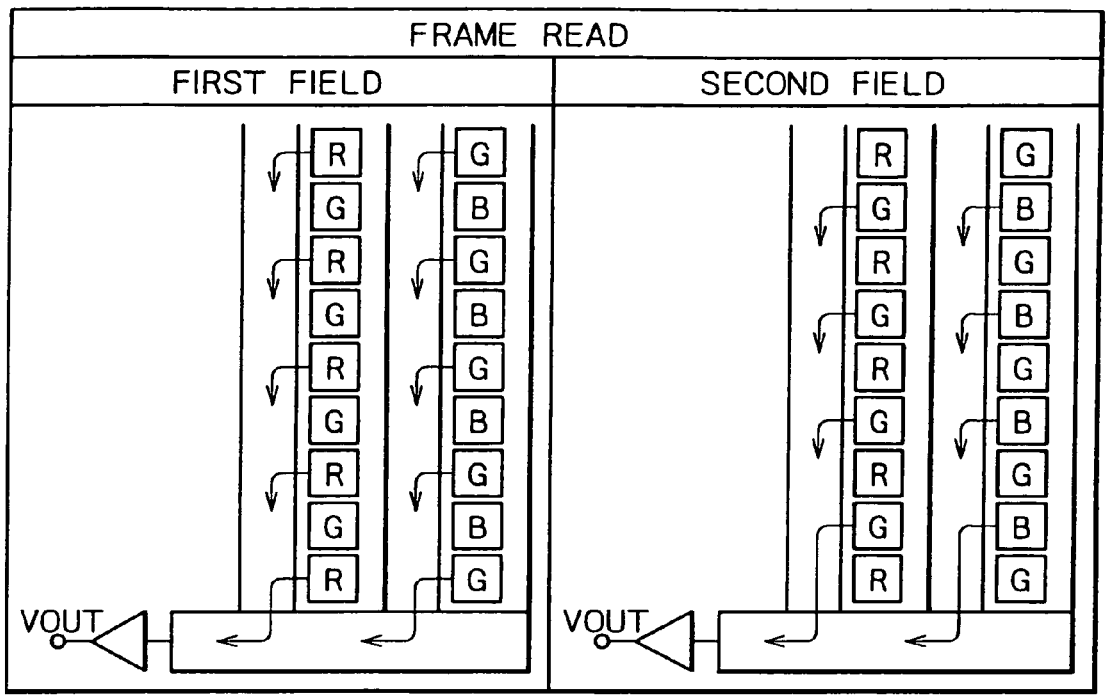
FIG. 24 is a schematic diagram illustrating a frame read operation.
Figure 25:
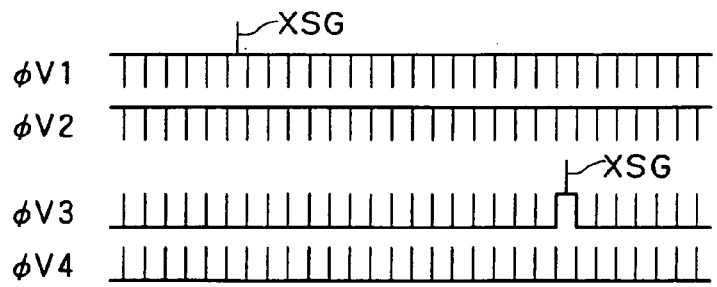
FIG. 25 is a timing chart illustrating vertical synchronization in the frame read operation.
Figure 26:
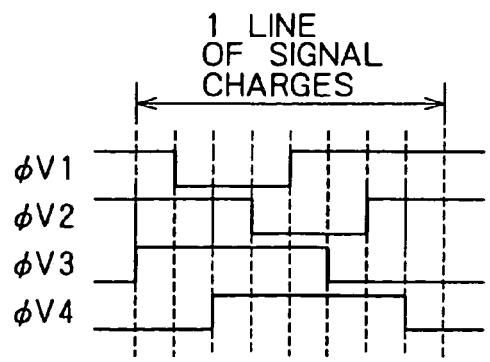
FIG. 26 is a timing chart illustrating horizontal synchronization in the frame read operation.
Figure 27:
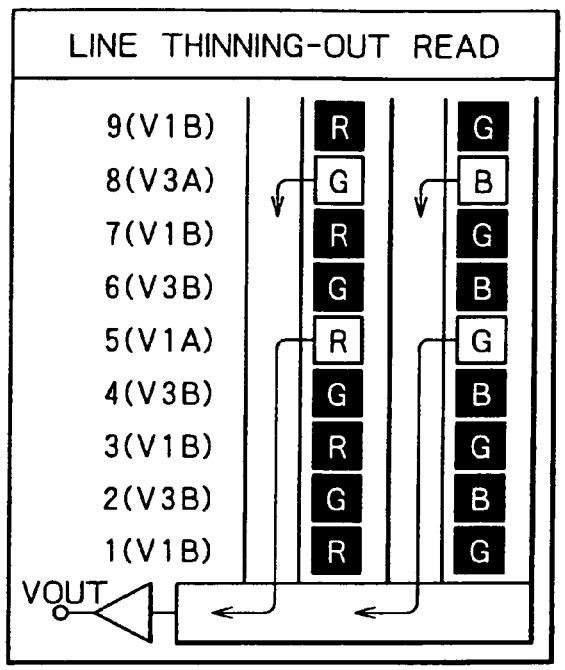
FIG. 27 is a schematic diagram illustrating a line thinning-out operation.
Figure 28:
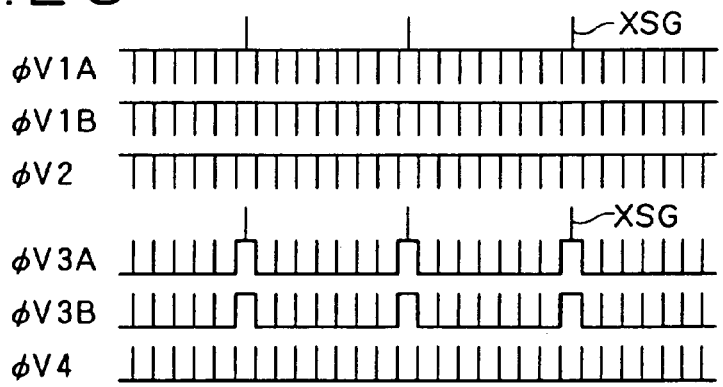
FIG. 28 is a timing chart illustrating vertical synchronization in the line thinning-out operation.
Figure 29:
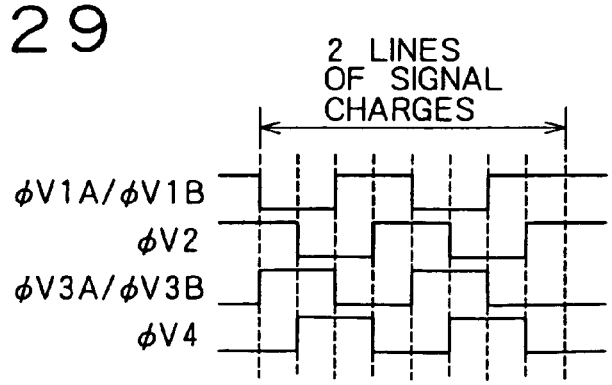
FIG. 29 is a timing chart illustrating horizontal synchronization in the line thinning-out operation.

FIG. 23 schematically shows a configuration of a camera system according to the present invention in which the solid-state imaging apparatus according to the above-mentioned preferred embodiments is used as the imaging device. This camera system is used for a digital still camera for example.

This camera system uses a CCD imaging device 71, which is the CCD imaging device according to the first preferred embodiment capable of frame reading (or all-pixel reading), the CCD imaging device capable of reading in which pixel addition in vertical transfer block and line addition in horizontal transfer block are combined, the CCD imaging device according to the second preferred embodiment capable of frame reading (or all-pixel reading), or the CCD imaging device capable of reading in which thinning-out and pixel addition in vertical transfer block or line addition in horizontal transfer block are combined.

Referring to FIG. 23, an image light entering from a subject (not shown) is focused onto the imaging surface of the CCD imaging device 71 through an optical system consisting of a lens 72 for example. The CCD imaging device 71 is driven by a CCD driver 73 that includes the above-mentioned timing generator 11 or 59. The substrate of the CCD imaging device 71 is applied with a substrate bias Vsub generated by a substrate bias generator 74. The substrate bias generator 74 is implemented by the substrate bias generator 20 described with reference to the first preferred embodiment or the substrate bias generator 60 described with reference to the second preferred embodiment.

An output signal (CCD output VOUT) of the CCD imaging device 71 is processed in a signal processor 75 in various signal processing operations such as automatic white balance (AWB) adjustment, the processed signal being outputted as an imaging signal. An operation mode setting block 76 is provided to set the operation mode of the CCD imaging device 71. This operation mode setting block 76 sets, for example, a normal imaging mode for shooting a still picture and a monitoring mode for monitoring a shot image through an LCD monitor for example.

The mode information indicative of the operation mode set by the operation mode setting block 76 is supplied to the CCD driver 73, the substrate bias generator 74, and the signal processor 75. In the normal imaging mode, the CCD driver 73 drives the CCD imaging device 71 so that a frame read operation (or an all-pixel read operation) is executed. In the monitoring mode, the CCD driver 73 drives the CCD imaging device 71 so that the addition read operation described with reference to the first and second specific examples of the first preferred embodiment or the special read mode described with reference to the first through third specific examples of the second preferred embodiment is executed.

In the normal imaging mode, the substrate bias generator 74 applies to the substrate of the CCD imaging device 71 a substrate bias Vsub1 set to an optimum value by considering the variation in potential of the overflow barrier of the sensor block caused by the fabrication variation of each CCD imaging device 71. In the monitoring mode, the substrate bias generator 74 applies to the substrate a substrate bias Vsub2 of which voltage value is set so that the saturation signal charge quantity of pixels becomes about 1/n, about 1/m, or about 1/(n×m) of that of the normal imaging mode where the number of pixels to be added is n (n≧2) and the number of lines to be added is m (m≧=2).

As described, in the camera system having the CCD imaging device 71, in the monitoring mode, the addition read operation according to the first preferred embodiment or the special read operation according to the second preferred embodiment is executed and, at the same time, the saturation signal charge quantity of pixels is set to about ½ of that in the normal imaging mode, thereby preventing the signal charge overflow due to the pixel addition or line addition from occurring in the vertical transfer block and the horizontal transfer block and significantly increasing the frame rate as compared with that in the normal imaging mode. This allows monitoring of a shot image as a smooth motion picture.

As described above, for monitoring the shot image through an LCD monitor for example, the addition read operation of the first preferred embodiment or the special read operation of the second preferred embodiment is executed for simplicity of description. Actually, however, these read operations are executed when executing AF control, AWB control, and AE control for example. In this case, the response speeds of the various automatic control devices can be raised, so that the number of pixels constituting the CCD imaging device 71 can be increased, thereby realizing a camera system of higher performance.

As described and according to the invention, a first operation mode for vertically independently transferring signal charges read from plural sensor blocks or a second operation mode for adding 2 pixels for example of signal charges in the vertical transfer block and vertically transferring the added signal charges is selected as the solid-state imaging device operating mode. In the second operation mode, the saturation signal charge quantity of the sensor block is set to about ½ of that in the first operation mode. Consequently, the number of output lines in the second operation mode becomes ½ of that of the first operation mode without increasing the frequency of the vertical transfer clocks, thereby doubling the frame rate as compared with that of the first operation mode and making the signal charge quantity after the addition in the second mode equal to that read in the first operation mode. This prevents the added signal charges from overflowing in the vertical transfer block and the horizontal transfer block.

Further, the first operation mode for vertically independently transferring the signal charges read from plural sensor blocks or the second operation mode in which, after reading the signal charges of only pixels providing a predetermined iterative unit, 2 pixels for example of signal charges are added for transfer in at least one of the vertical transfer block or the horizontal transfer block is selected as the operation mode of the solid-state imaging device. In the second operation mode, the saturation signal charge quantity of the sensor block is set to about ½ of that in the first operation mode. Consequently, in the second mode, when 2 pixels of signal charges are thinned out of every 4 pixels in the row direction, the number of output lines can be reduced to ¼ of that in the first operation mode, thereby raising the frame rate 4 times as high as that in the first operation mode and making the signal charge quantity after the addition in the second operation mode equal to the signal charge quantity read in the first mode. This prevents the added signal charges from overflowing in the vertical transfer block and the horizontal transfer block.

While the preferred embodiments of the present invention have been described using specific terms, such description is for illustrative purposes only, and it is to be understood that changes and variations may be made without departing from the spirit or scope of the appended claims.

What is claimed is:
1. A solid-state imaging apparatus comprising:
  a solid-state imaging device having a plurality of sensor blocks arranged in a matrix for performing photoelectric conversion, a vertical transfer block for vertically transferring signal charges read from said plurality of sensor blocks, and a horizontal transfer block for horizontally transferring the signal charges supplied from said vertical transfer block;

a driving means for selectively setting a first operation mode for vertically independently transferring the signal charges read from said plurality of sensor blocks and a second operation mode for adding n (n≧2) pixels of signal charges in said vertical transfer block for vertical transfer and m (m≧2) lines of signal charges are added in said horizontal transfer block for horizontal transfer; and a saturation signal charge quantity setting means for setting a saturation signal charge quantity of said plurality of sensor blocks in said second operation mode to about 1/(n×m) of a saturation signal charge quantity of said plurality of sensor blocks in said first operation mode.

2. A solid-state imaging apparatus comprising:

a solid-state imaging device having a plurality of sensor blocks arranged in a matrix for performing photoelectric conversion, a vertical transfer block for vertically transferring signal charges read from said plurality of sensor blocks, and a horizontal transfer block for horizontally transferring the signal charges supplied from said vertical transfer block;

a driving means for selectively setting a first operation mode for vertically independently transferring the signal charges read from said plurality of sensor blocks and a second operation mode for, after reading signal charges of only pixels providing a predetermined iterative unit from said plurality of sensor blocks, adding N (N≧2) pixels of signal charges in said vertical transfer block and adding m (m≧2) lines of signal charges in said horizontal transfer block for transfer; and a saturation signal charge quantity setting means for setting a saturation signal charge quantity of said plurality of sensor blocks in said second operation mode to about 1/(N×m) of a saturation signal charge quantity of said plurality of sensor blocks in said first operation mode.

3. A solid-state imaging apparatus according to claim 2, wherein said driving means sets as said second operation modes at least two types of modes of a first line addition mode for adding x (x≧2) lines of signal charges in said horizontal transfer block for horizontal transfer and a second line addition mode for adding y (y≧x) lines of signal charges for horizontal transfer and said saturation signal charge quantity setting means sets a saturation signal charge quantity of said plurality of sensor blocks in said first line addition mode to about 1/x of the saturation signal charge quantity of said plurality of sensor blocks in said first operation mode and a saturation signal charge quantity of said plurality of sensor blocks in said second line addition mode to about 1/y of the saturation signal charge quantity of said plurality of sensor blocks in said first operation mode.

4. A method of driving a solid-state imaging apparatus comprising a solid-state imaging device having a plurality of sensor blocks arranged in a matrix for performing photoelectric conversion, a vertical transfer block for vertically transferring signal charges read from said plurality of sensor blocks, and a horizontal transfer block for horizontally transferring the signal charges supplied from said vertical transfer block, said method comprising the steps of:

setting selectively as an operation mode of said solid-state imaging device a first operation mode for vertically independently transferring the signal charges read from said plurality of sensor blocks and a second operation mode for adding n (n≧2) pixels of signal charges in said vertical transfer block for vertical transfer and adding m (m≧2) lines of signal charges in said horizontal transfer block for horizontal transfer; and selectively setting, in said second operation mode, the saturation signal charge quantity of said plurality of sensor blocks to about 1/(n×m) of the saturation signal charge quantity of said plurality of sensor blocks in said first operation mode.

5. A method of driving a solid-state imaging apparatus comprising a solid-state imaging device having a plurality of sensor blocks arranged in a matrix for performing photoelectric conversion, a vertical transfer block for vertically transferring signal charges read from said plurality of sensor blocks, and a horizontal transfer block for horizontally transferring the signal charges supplied from said vertical transfer block, said method comprising the steps of:

setting selectively as an operation mode of said solid-state imaging device a first operation mode for vertically independently transferring the signal charges read from said plurality of sensor blocks and a second operation mode for, after reading signal charges of only pixels providing a predetermined iterative unit from said plurality of sensor blocks, adding N (N≧2) pixels of signal charges in said vertical transfer block and adding m (m≧2) lines of signal charges in said horizontal transfer block for transfer; and selectively setting, in said second operation mode, the saturation signal charge quantity of said plurality of sensor blocks to about 1/(N×m) of the saturation signal charge quantity of said plurality of sensor blocks in said first operation mode.

6. A camera system comprising:

a solid-state imaging device having a plurality of sensor blocks arranged in a matrix for performing photoelectric conversion, a vertical transfer block for vertically transferring signal charges read from said plurality of sensor blocks, and a horizontal transfer block for horizontally transferring the signal charges supplied from said vertical transfer block;

a driving means for selectively setting a first operation mode for vertically independently transferring the signal charges read from said plurality of sensor blocks and a second operation mode for adding n (n≧2) pixels of signal charges in said vertical transfer block for vertical transfer and m (m≧2) lines of signal charges are added in said horizontal transfer block for horizontal transfer; and a saturation signal charge quantity setting means for setting a saturation signal charge quantity of said plurality of sensor blocks in said second operation mode to about 1/(n×m) of a saturation signal charge quantity of said plurality of sensor blocks in said first operation mode.

7. A camera system comprising:

a solid-state imaging device having a plurality of sensor blocks arranged in a matrix for performing photoelectric conversion, a vertical transfer block for vertically transferring signal charges read from said plurality of sensor blocks, and a horizontal transfer block for horizontally transferring the signal charges supplied from said vertical transfer block;

a driving means for selectively setting a first operation mode for vertically independently transferring the signal charges read from said plurality of sensor blocks and a second operation mode for, after reading signal charges of only pixels providing a predetermined iterative unit from said plurality of sensor blocks, adding N (N≧2) pixels of signal charges in said vertical transfer block and adding m (m≧2) lines of signal charges in said horizontal transfer block for transfer; and a saturation signal charge quantity setting means for setting a saturation signal charge quantity of said plurality of sensor blocks in said second operation mode to about 1/(N×m) of a saturation signal charge quantity of said plurality of sensor blocks in said first operation mode.

* * * * *